United States Patent
Ohtaki

(10) Patent No.: US 6,879,169 B2
(45) Date of Patent: Apr. 12, 2005

(54) METHOD FOR MANUFACTURING AND BATCH TESTING SEMICONDUCTOR DEVICES

(75) Inventor: Mikio Ohtaki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/904,663

(22) Filed: Jul. 16, 2001

(65) Prior Publication Data

US 2002/0030501 A1 Mar. 14, 2002

Related U.S. Application Data

(62) Division of application No. 09/434,490, filed on Nov. 5, 1999, now Pat. No. 6,407,563.

(30) Foreign Application Priority Data

Mar. 12, 1999 (JP) ............................................. 11-66621

(51) Int. Cl.⁷ .............................................. G01R 31/02

(52) U.S. Cl. ....................................... 324/754; 324/760

(58) Field of Search ................................ 324/754–755, 324/758, 760, 765, 158.1, 761; 438/14–17

(56) References Cited

U.S. PATENT DOCUMENTS

| | | | | |
|---|---|---|---|---|
| 4,961,052 A | * | 10/1990 | Tada et al. ................ | 324/158.1 |
| 5,021,733 A | * | 6/1991 | Ebihara et al. ............. | 324/760 |
| 5,206,181 A | * | 4/1993 | Gross .......................... | 438/18 |
| 5,258,648 A | * | 11/1993 | Lin ............................ | 361/749 |
| 5,279,975 A | * | 1/1994 | Devereaux et al. ........... | 438/18 |
| 5,317,255 A | * | 5/1994 | Suyama et al. ............. | 324/754 |
| 5,327,075 A | * | 7/1994 | Hashinaga et al. ...... | 324/158.1 |
| 5,414,370 A | * | 5/1995 | Hashinaga et al. ......... | 324/760 |
| 5,461,327 A | * | 10/1995 | Shibata et al. ............. | 324/760 |
| 5,477,160 A | * | 12/1995 | Love .......................... | 324/755 |
| 5,517,126 A | * | 5/1996 | Yamaguchi .................. | 324/754 |
| 5,532,610 A | * | 7/1996 | Tsujide et al. ............. | 324/757 |
| 5,541,524 A | * | 7/1996 | Tuckerman et al. ........ | 324/754 |
| 5,557,215 A | * | 9/1996 | Saeki et al. ................. | 324/765 |
| 5,563,521 A | | 10/1996 | Crumly | |
| 5,597,767 A | * | 1/1997 | Mignardi et al. ............. | 438/14 |
| 5,606,263 A | * | 2/1997 | Yoshizawa et al. ......... | 324/761 |

(Continued)

FOREIGN PATENT DOCUMENTS

| | | |
|---|---|---|
| JP | 64001252 | 1/1989 |
| JP | 64-001252 | 1/1989 |
| JP | 07288271 | 10/1995 |
| JP | 09033606 | 2/1997 |
| JP | 10-189670 | 7/1998 |
| JP | 10189670 | 7/1998 |
| JP | 10000208 A | 9/1998 |
| JP | 11-17076 | 1/1999 |
| JP | 11017076 A | 1/1999 |
| JP | 11017076 | 1/1999 |

*Primary Examiner*—Michael Tokar
*Assistant Examiner*—Jermele Hollington
(74) *Attorney, Agent, or Firm*—Rabin & Berdo, PC

(57) ABSTRACT

A semiconductor device test apparatus according to the present invention includes a circuit board 103 and a film 105. A plurality of electrodes 103c are formed at the circuit board 103 at positions that face opposite a plurality of electrodes 201a at a device to be measured 201, whereas bumps 105b are formed at the surface of the film 105 located toward the device to be measured 201, at positions that face opposite the plurality of electrodes 201a at the device to be measured 201 and electrodes 105c are formed at the surface of the film 105 located toward the circuit board 103 at positions that face opposite the plurality of electrodes 103c at the circuit board 103. The bumps 105b formed at one surface of the film 105 and the electrodes 105c formed at another surface of the film 105 are electrically connected with each other via through holes 105d to support semiconductor devices having electrodes provided at a fine pitch and to improve durability.

14 Claims, 33 Drawing Sheets

U.S. PATENT DOCUMENTS

| | | | | |
|---|---|---|---|---|
| 5,663,654 A | * | 9/1997 | Wood et al. | 324/758 |
| 5,672,977 A | | 9/1997 | Yamada | |
| 5,821,762 A | * | 10/1998 | Hamaguchi et al. | 324/754 |
| 5,896,038 A | * | 4/1999 | Budnaitis et al. | 324/754 |
| 5,945,834 A | * | 8/1999 | Nakata et al. | 324/754 |
| 5,953,214 A | * | 9/1999 | Dranchak et al. | 324/755 |
| 5,986,282 A | * | 11/1999 | Seki | 438/15 |
| 6,046,598 A | * | 4/2000 | Miyaji et al. | 324/754 |
| 6,232,791 B1 | * | 5/2001 | Jitsumori et al. | 324/765 |
| 6,250,933 B1 | * | 6/2001 | Khoury et al. | 324/754 |
| 6,297,658 B1 | * | 10/2001 | Nakata et al. | 324/754 |
| 6,372,528 B1 | * | 4/2002 | Yamamoto | 324/760 |
| 6,407,563 B2 | * | 6/2002 | Ohtaki | 324/754 |
| 6,440,771 B1 | * | 8/2002 | Pierce | 438/106 |

\* cited by examiner ated is employed to test a newly developed device in
METHOD FOR MANUFACTURING AND BATCH TESTING SEMICONDUCTOR DEVICES This is a Divisional of Applicant's application Ser. No. 09/434,490 filed Nov. 5, 1999, now U.S. Pat. No. 6,407,563.

BACKGROUND OF THE INVENTION

The present invention relates to a semiconductor device test apparatus.

An IC socket which matches the shape of the device to be measured is employed to test a newly developed device in the prior art. An IC socket, which comes into electrical contact with the device to be measured, fulfills a function as a means for electrical signal communication between a peripheral device and the device to be measured.

Now, the IC socket, the device to be measured and the connection between the IC socket and the device to be measured are explained in reference to FIGS. 29, 30 and 31.

FIG. 29 is a sectional view of a device to be measured 1 and an IC socket 3 mounted at a circuit board 5, illustrating the connections among them. The IC socket 3 is provided with a plurality of contacts 3a, and is soldered onto the circuit board 5 at the contacts 3a. The device to be measured 1, which is pressed down by a holding member 7, is electrically connected with the contacts 3a of the IC socket 3.

FIG. 30 is a perspective of the device to be measured 1, showing its surface on which electrodes are formed. The device to be measured 1 is a CSP (chip-size package) device achieved through chip size packaging. The device to be measured 1 is provided with a plurality of electrodes 1a through which electrical signals are input and output and power is supplied. The individual contacts 3a provided at the IC socket 3 are positioned so that they come in contact with the corresponding electrodes 1a.

FIG. 31 is a plan view of the circuit board 5 with the devices to be measured 1 and the IC sockets 3 mounted, viewed from above. The circuit board 5 is allowed to engage in electrical signal communication with peripheral devices such as an IC tester and a burn-in apparatus (not shown) via connection terminals 5a and 5b.

With the devices to be measured 1, the IC socket 3 and the circuit board 5 configured as described above, electrical signals input to the circuit board 5 from peripheral devices via the connection terminals 5a and 5b and a source voltage travel through the contacts 3a of the IC socket 3 to be supplied to the devices to be measured 1 through the electrodes 1a. In addition, electrical signals output by the devices to be measured 1 travel through the reverse route to reach the peripheral devices. Such electrical connection enable functional tests on the devices 1 to be measured.

Apart from functional tests achieved by employing IC sockets as described above, a functional test on a wafer-level device, in particular, is implemented by adopting a method whereby probes are placed in contact with wafer pads constituting signal input/output electrodes and source electrodes of the device.

Since the wafer and the probes are placed in contact a great number of times in such functional tests employing probes, the contact durability of the probe is a critical concern. If the contact durability of the probes is poor, the cost of the functional test is bound to increase, raising the price of the device itself. For this reason, probes are normally constituted of materials with a high degree of hardness such as tungsten and beryllium copper.

FIG. 32 illustrates a probe card 13 provided with probes 11. At the probe card 13, a specific circuit that corresponds to the device to be measured is printed, and electrical signal communication with peripheral devices (not shown) is enabled via connection terminals 13a and 13b.

The positional relationship between a probe card 13 and the wafer 15 which constitutes the device to be measured is illustrated in FIG. 33. Electrical signals provided by a peripheral device are input to the probe card 13 via the connection terminals 13a and 13b, travel through the circuit formed at the probe card 13 to reach the probe 11. Then, the electrical signals are applied to the pads formed at the wafer 15 from the probe 11. In addition, electrical signals output by the wafer 15 travel through the reverse route to reach a peripheral device. The structure described above enables a functional test on the wafer 15.

However, the following problems are yet to be addressed in functional tests conducted by utilizing IC sockets and functional tests conducted by utilizing probes.

The smallest pitch for contacts at an IC socket is currently 0.65 mm. At the same time, the package size has been reduced in recent years, with the CSP being a typical example, and as a result, the electrode pitch at the device has been switched from 1.27 mm to 0.8 mm or 0.5 mm. This reduction in the electrode pitch at the device necessitates a reduction in the pitch of the contacts at the IC socket.

However, in order to reduce the contact pitch at an IC socket to 0.65 mm or smaller, the IC socket machining accuracy must be improved. This will inevitably raise the production cost of the IC socket, and may result in a large increase in the device price.

In addition, the body size of IC sockets imposes a restriction upon the number of IC sockets that can be mounted at a circuit board. Such restriction on the number of IC sockets that can be mounted at the circuit board ultimately restricts the number of devices that can be tested in a single functional test. Thus, functional tests conducted on devices utilizing IC sockets in the prior art are not always efficient.

In order to achieve a higher degree of efficiency in functional tests conducted by employing probes, it is desirable to increase the number of probes mounted at a probe card so that many devices can be tested at once. However, probes are secured to the probe card using a resin or the like in the prior art, which requires a large space for securing them. Thus, it is difficult to increase the number of probes without increasing the probe card size.

Furthermore, as higher integration of devices becomes more common, the pitch of the device pads with which probes come in contact is becoming narrower. This reduction in the pad pitch necessitates a reduction in the pitch of probes mounted at the probe card. However, it is difficult to reduce the probe pitch in the structure adopted in the prior art.

SUMMARY OF THE INVENTION

An object of the present invention, which has been completed by addressing the problems of the prior art discussed above, is to provide a semiconductor device test apparatus that can be employed to test semiconductor devices with electrodes provided at a fine pitch and also achieves a high degree of durability. Another object of the present invention is to provide a semiconductor device test apparatus that is capable of batch testing a great number of semiconductor devices.

In order to achieve the objects described above, according to the present invention, a semiconductor device test apparatus that is capable of testing one or a plurality of semiconductor devices each provided with a plurality of electrodes. The semiconductor device test apparatus according to the present invention is characterized in that it is provided with a circuit board having a circuit that corresponds to the semiconductor device and a plurality of electrodes that correspond to individual electrodes at the semiconductor device and a connection plate that is provided with a plurality of conductive portions that electrically connect the individual electrodes at the semiconductor device and the individual electrodes at the circuit board on a one-to-one basis. This structure allows the semiconductor device to be electrically connected to the circuit board via the connection plate. The semiconductor device can be driven by inputting various types of electrical signals to the circuit board from peripheral devices, and various types of electrical signals output by the semiconductor device are communicated to the peripheral devices. In addition, by providing the connection plate having a plurality of conductive portions provided to electrically connect the individual electrodes at the semiconductor device and the individual electrodes at the circuit board, an extremely simple structure is realized for the apparatus.

The conductive portions are each formed at one of a plurality of through holes provided at the connection plate. Even when electrodes at the semiconductor device are arrayed over an extremely fine pitch, the semiconductor device can be tested with ease by reducing the electrode pitch at the circuit board and reducing the through hole pitch.

A conductive elastic body that electrically connects the individual conductive portions at the connection plate and the individual electrodes at the semiconductor device on a one-to-one basis is provided between the connection plate and the semiconductor device. By adopting this structure, the pressure applied by the conductive portions at the connection plate to the individual electrodes at the semiconductor device when they are electrically connected with each other is reduced. The structure may be effectively adopted when, for instance, the electrodes at the semiconductor device are ball-type electrodes.

Furthermore, a positioning member that secures the semiconductor device may be provided. This positioning member may be constituted of a plate member having a through portion formed that corresponds to the shape of the semiconductor device, for instance. Such a configuration will allow the semiconductor device to be secured through an extremely simple structure. In addition, the space required to secure the semiconductor device can be reduced.

Moreover, the circuitboard, the connection plate and the positioning member may be provided as an integrated unit, or the circuitboard, the connection plate, the conductive elastic body and the positioning member may be provided as an integrated unit. Such a structure eliminates the necessity for assembling the circuit board, the connection plate and the positioning member when testing the semiconductor device, to achieve a higher degree of efficiency in testing.

By providing a holding member that presses the semiconductor device toward the connection plate, the position of the semiconductor device becomes fixed and more reliable electrical connection is achieved for the semiconductor device and the circuit board.

It is desirable to provide a buffer member at the location where the holding member is in contact with the semiconductor device. By providing such a buffer member, the pressure applied from the holding member is distributed evenly and correctly at the semiconductor device.

By using film to constitute the connection plate, an extremely thin connection plate is realized. In addition, since the connection plate constituted of film can bend freely, more reliable electrical connection between the individual electrodes at the semiconductor device and the individual electrodes at the circuit board is assured.

Alternatively, a printed board may be used to constitute the connection plate. By adopting such a printed board, the production cost can be reduced compared to the cost of production using film.

In addition, according to the present invention, a semiconductor device test apparatus employed to test one or a plurality of semiconductor devices each having a plurality of electrodes, which is characterized in that it is provided with a probe holding member having a plurality of probes fitted therein so that the individual sharp ends of the plurality of probes corresponding to the individual electrodes at the semiconductor device on a one-to-one basis and the ends of the probes located on the other side of the sharp ends are exposed. By adopting this structure, it becomes possible to mount a plurality of probes while requiring only a small area, so that finer pitches for electrodes at the semiconductor device can be supported.

By forming notched portions in an area located inside the probe holding member, the individual probes can be held by the probe holding member with a high degree of reliability.

In addition, by providing a plurality of conductive elastic portions, each corresponding to one of the probes, the sharp ends of the probes can be placed in contact with the semiconductor device with a high degree of reliability.

It is desirable to form a gold-clad film, at least in areas where the individual probes come into contact with the conductive elastic portions. This gold-clad film will prevent the formation of an oxide film to assure good electrical continuity between the probes and the conductive elastic portions to allow the flow of a very weak current.

Furthermore, according to the present invention, a chip or a wafer may be used as the semiconductor device to be tested.

BRIEF DESCRIPTION OF THE DRAWINGS

The above and other features of the invention and the concomitant advantages will be better understood and appreciated by persons skilled in the field to which the invention pertains in view o the following description given in conjunction with the accompanying drawings which illustrate preferred embodiments.

DETAILED DESCRIPTION OF THE PREFERRED EMBODIMENTS

The following is a detailed explanation of the preferred embodiments of the semiconductor device test apparatus according to the present invention, given in reference to the attached drawings. It is to be noted that in the following explanation and the attached drawings, the same reference numbers are assigned to components having practically identical functions and structural features to preclude the necessity for repeating the explanation thereof.

First Embodiment

Figure 1:
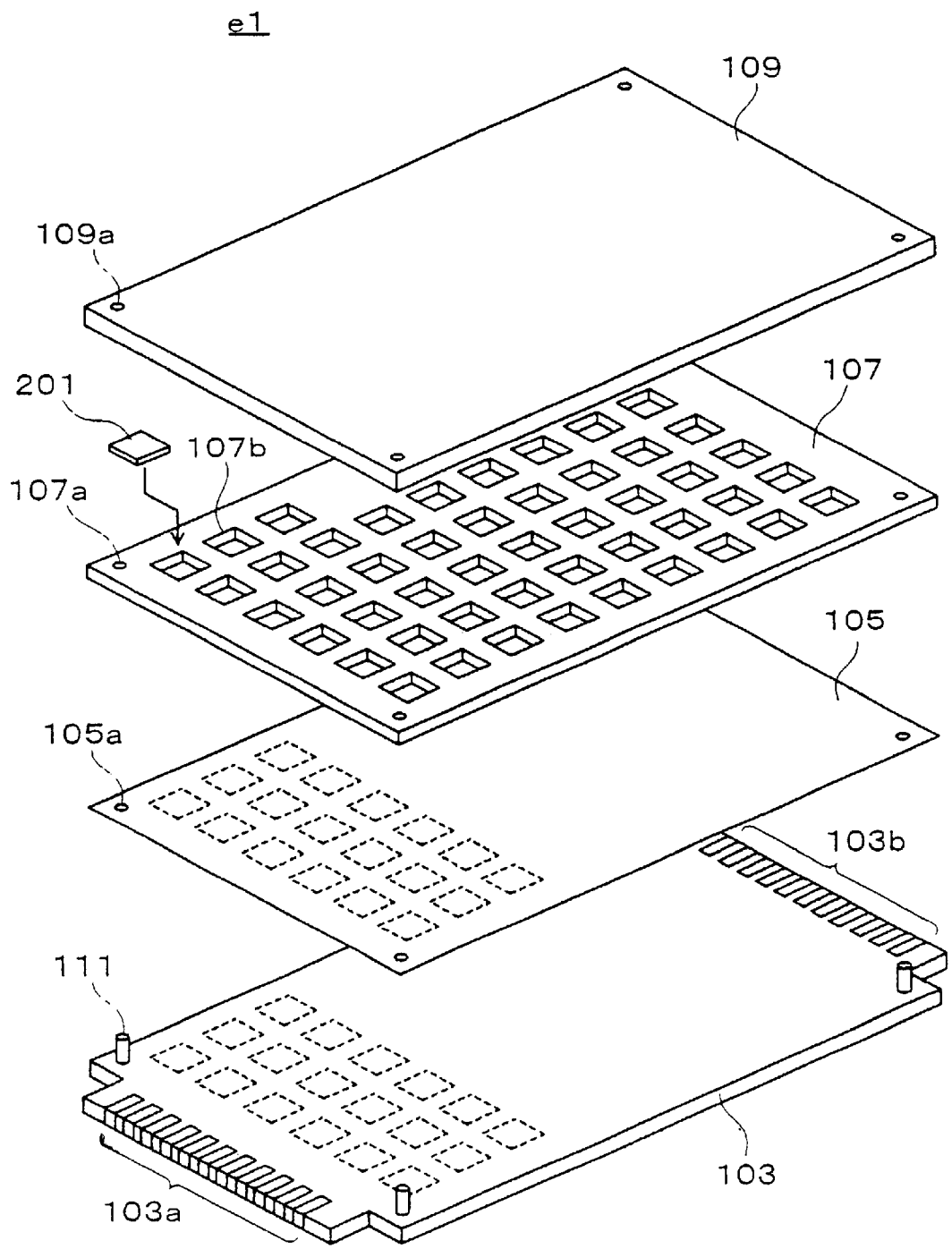
FIG. 1 is a perspective illustrating the structure of the semiconductor device test apparatus in a first embodiment.

As illustrated in FIG. 1, a semiconductor device test apparatus e1 in the first embodiment of present invention adopts a structure that includes a circuit board 103, a film 105, a positioning plate 107 and a holding plate 109.

The circuit board 103, which is connected to peripheral devices (not shown) via connection terminals 103a and 103b, enables input and output of various types of electrical signals and a source voltage. The circuit board 103 may be constituted of, for instance, a multilayer substrate.

The film 105, the positioning plate 107 and the holding plate 109 are respectively provided with reference holes 105a, 107a and 109a at the four corners, and they are secured onto the circuit board 103 by pins 111.

The positioning plate 107 is provided with a plurality of through holes 107b constituting positioning members so that it can align devices to be measured 201. The through holes 107b are formed in a shape that corresponds to the external shape of the devices to be measured 201.

Figure 2:
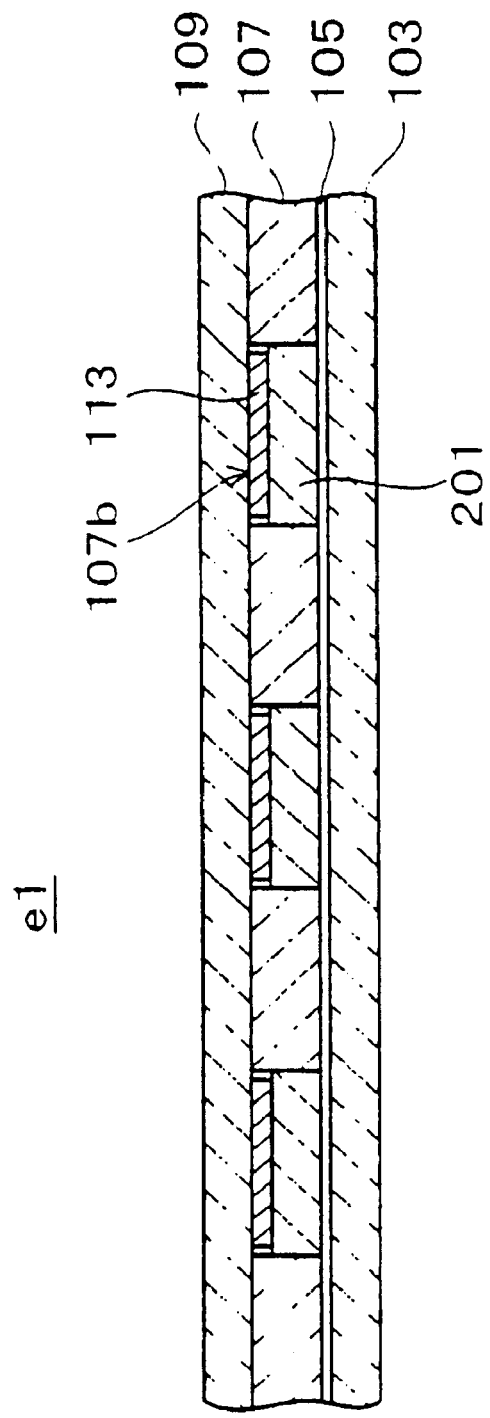
FIG. 2 is a sectional view of the semiconductor device test apparatus in FIG. 1.

FIG. 2 is a sectional view illustrating the semiconductor device test apparatus e1 in the first embodiment and a plurality of devices to be measured 201 fitted at the semiconductor device test apparatus e1 for the purpose of various types of functional tests. The devices to be measured 201 are each inserted at a through hole 107b at the positioning plate 107 and are held against the film 105 by the holding plate 109. In addition, a buffer member 113 is provided between each device to be measured 201 and the holding plate 109 to ensure that the pressure from the holding plate 109 is distributed to the individual devices to be measured 201 evenly and correctly. Furthermore, the film 105 is held against the circuit board 103 with the pressure applied by the holding plate 109.

Figure 3:
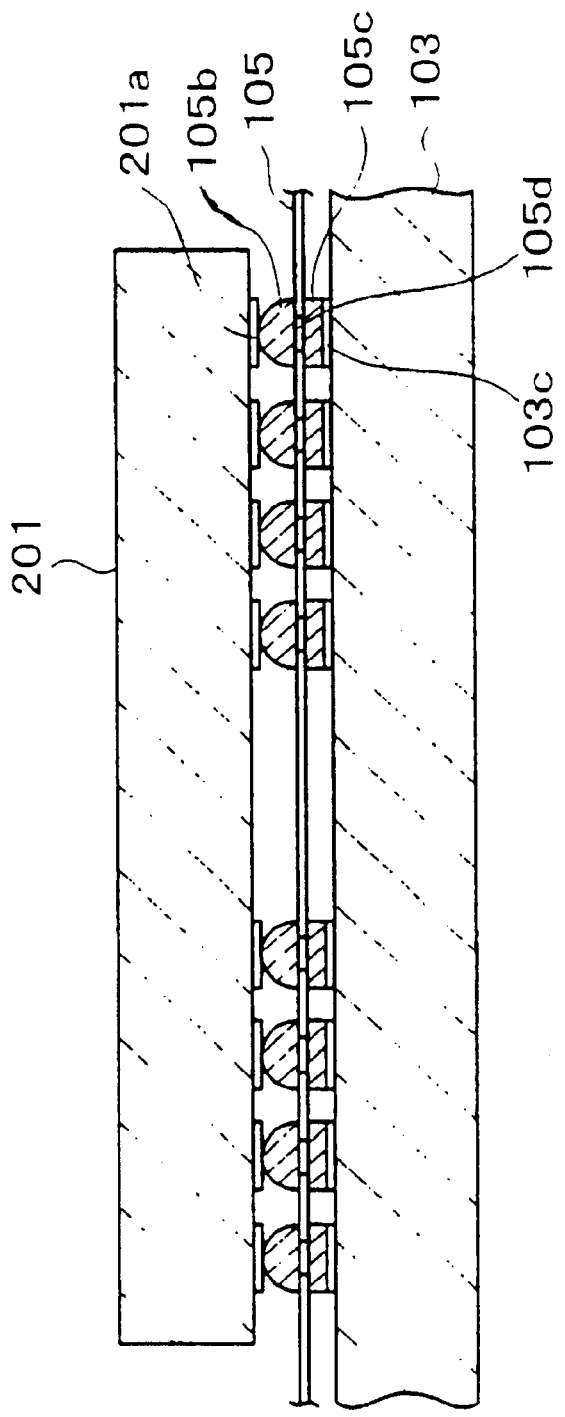
FIG. 3 is an enlargement of the sectional view of the semiconductor device test apparatus in FIG. 2.

Now, the connections among the devices to be measured 201, the film 105 and the circuit board 103 are explained in reference to FIG. 3 which is an enlargement of FIG. 2.

At the circuit board 103, a plurality of electrodes 103c are formed at positions that face opposite a plurality of electrodes 201a at the device to be measured 201.

Bumps 105b are formed at the surface of the film 105 located toward the device to be measured 201, at positions that face opposite the plurality of electrodes 201a at the device to be measured 201. These bumps 105b, which are terminals capable of supplying source voltage and inputting/outputting various types of electrical signals, are each formed in a semi-spherical shape through electrolytic plating. They may be constituted of, for instance, copper, with their surfaces processed in a gold plating treatment. Alternatively, instead of the bumps, projections may be formed through etching.

Electrodes (lands) 105c are formed at the surface of the film 105 located toward the circuit board 103, at positions facing opposite the plurality of electrodes 103c at the circuit board 103. The bumps 105b and the electrodes 105c formed at different surfaces of the film 105 are electrically connected via through holes 105d.

When conducting a functional test on the devices to be measured 201, various types of electrical signals output by peripheral devices (not shown) and the source voltage are input to the circuit board 103 via the connection terminals 103a and 103b, travel through the wiring circuit formed at the circuit board 103 and reach the electrodes 103c. As illustrated in FIGS. 2 and 3, the electrodes 103c are electrically connected with the electrodes 201a formed at the devices to be measured 201 via the electrodes 105c and the bumps 105b formed at the film 105. Consequently, various types of electrical signals output by the peripheral devices and the source voltage are provided to the devices to be measured 201 to electrically drive the devices to be measured 201. In addition, the various types of electrical signals output by the devices to be measured 201 travel through the bumps 105b and the electrodes 105c formed at the film 105, are taken into the circuit board 103 via the electrodes 103c and are further sent out to the peripheral devices.

When the semiconductor device test apparatus e1 in the first embodiment structured as described above, which does not include any contacts formed through machining as an IC sockets 3 in the prior art is adopted, a reduction in the pitch of the plurality of electrodes 201a formed at each device to be measured 201 can be supported. For instance, even when the pitch of the electrodes 201a is equal to or less than 0.5 mm, functional tests can be conducted on the devices to be measured 201.

In addition, the semiconductor device test apparatus e1 in the first embodiment, which is provided with the positioning plate 107 capable of aligning a plurality of devices to be measured 201 in a batch, does not require an IC socket to be provided for each device to be measured 201. Thus, the expense of providing IC sockets is eliminated. In addition, by using the area on the circuit board 103 which is occupied by the body portions of the IC sockets in the prior art, a larger number of devices to be measured 201 can be mounted at the circuit board 103 so that even more devices to be measured can be tested in a single functional test.

Second Embodiment

Figure 4:
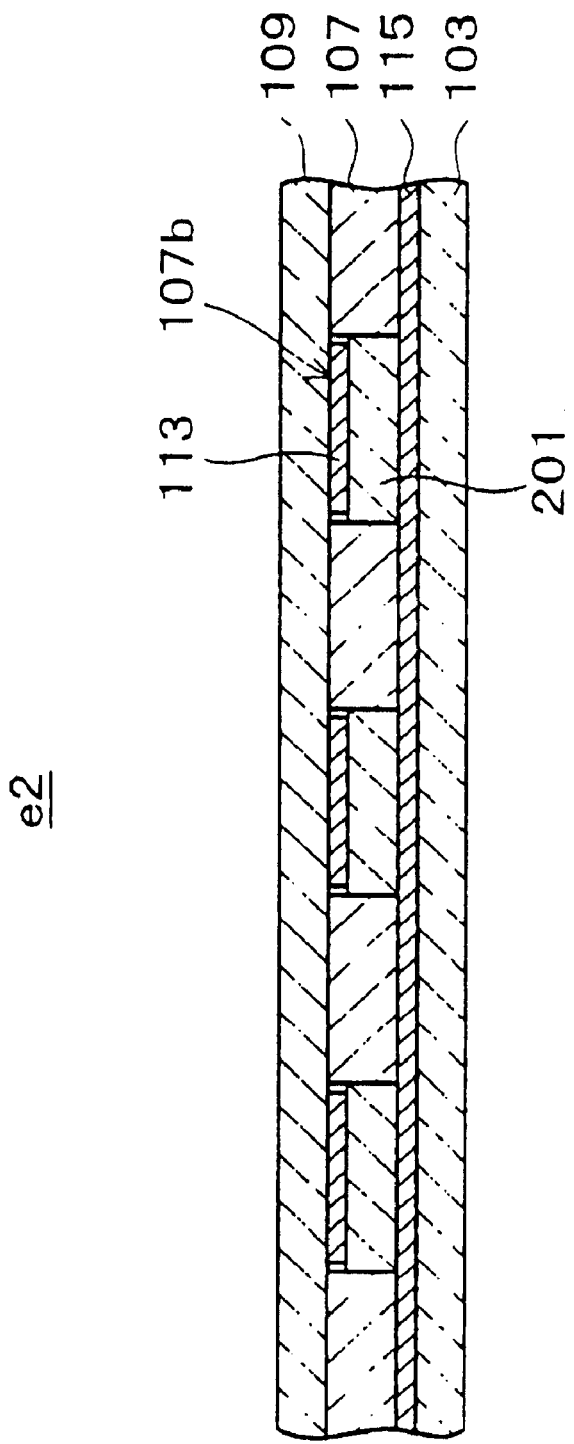
FIG. 4 is a sectional view illustrating the structure of the semiconductor test apparatus in a second embodiment.

FIG. 4 is a sectional view illustrating a semiconductor device test apparatus e2 in the second embodiment of the present invention and a plurality of devices to be measured 201 that are fitted at the semiconductor device test apparatus e2 for the purpose of various types of functional tests. The semiconductor device test apparatus e2 in the second embodiment adopts a structure which is achieved by replacing the film 105 in the semiconductor device test apparatus e1 in the first embodiment with a printed board 115, as illustrated in FIG. 4.

The devices to be measured 201 are each inserted at a through hole 107b at the positioning plate 107 and are held against the printed board 115 by the holding plate 109. In addition, a buffer member 113 is provided between each device to be measured 201 and the holding plate 109 to ensure that the pressure from the holding plate 109 is distributed to the individual devices to be measured 201 evenly and correctly. Furthermore, the printed board 115 is held against the circuit board 103 with the pressure applied by the holding plate 109.

Figure 5:
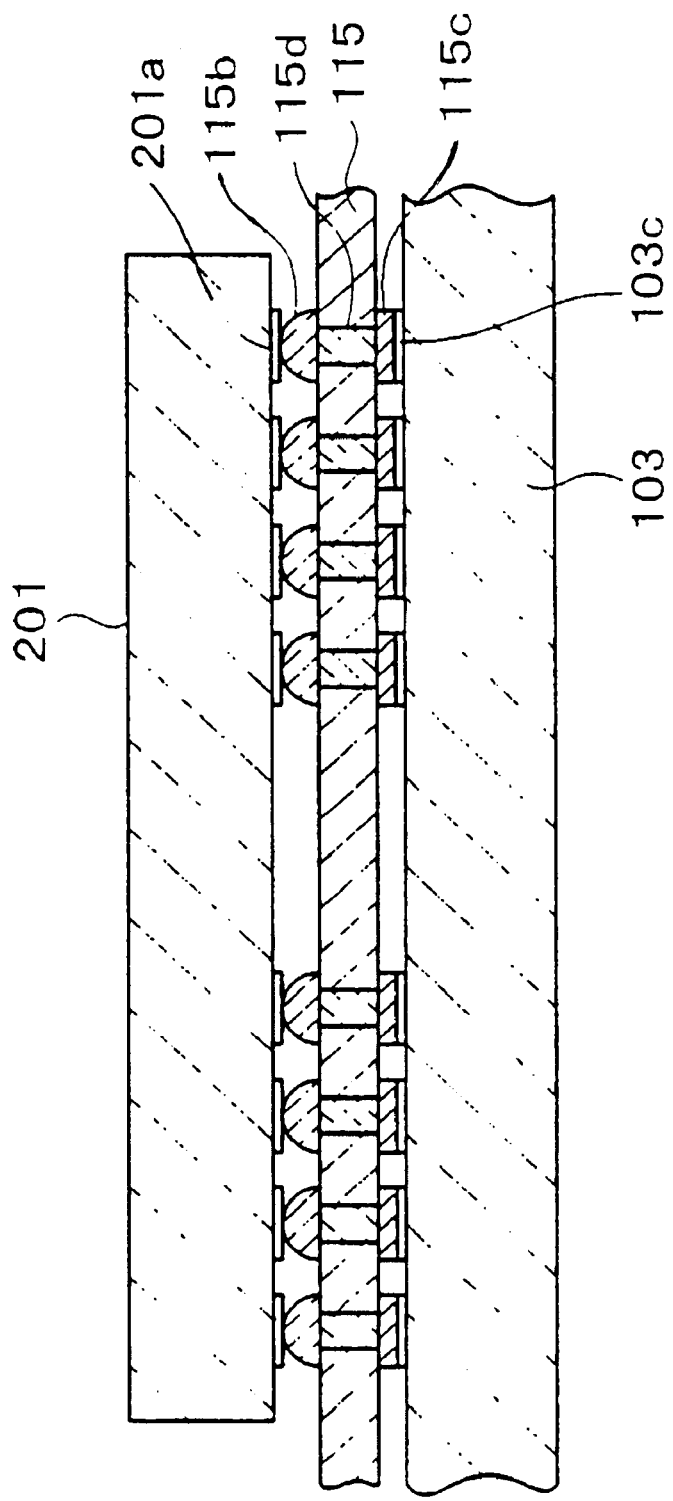
FIG. 5 is an enlargement of the sectional view of the semiconductor device test apparatus in FIG. 4.

Now, the connections among a device to be measured 201, the printed board 115 and the circuit board 103 are explained in reference to FIG. 5 which is an enlargement of FIG. 4.

Bumps 115b are formed at the surface of the printed board 115 located toward the device to be measured 201, at positions that face opposite the plurality of electrodes 201a at the device to be measured 201. These bumps 115b, which are terminals capable of supplying the source voltage and inputting/outputting various types of electrical signals, are each formed in a semi-spherical shape through electrolytic plating. They may be constituted of, for instance, copper, with their surfaces processed in a gold plating treatment. Alternatively, instead of the bumps, projections may be formed through etching.

Electrodes (lands) 115c are formed at the surface of the printed board 115 located toward the circuit board 103, at positions facing opposite the plurality of electrodes 103c at the circuit board 103. The bumps 115b and the electrodes 115c formed at different surfaces of the printed board 115 are electrically connected via through holes 115d.

When conducting a functional test on the devices to be measured 201, various types of electrical signals output by peripheral devices (not shown) and the source voltage are input to the circuit board 103 via the connection terminals 103a and 103b, travel through the wiring circuit formed at the circuit board 103 and reach the electrodes 103c. As illustrated in FIGS. 4 and 5, the electrodes 103c are electrically connected with the electrodes 201a formed at the devices to be measured 201 via the electrodes 115c and the bumps 115b formed at the printed board 115. Consequently, various types of electrical signals output by the peripheral devices and the source voltage are provided to the devices to be measured 201 to electrically drive the devices to be measured 201. In addition, the various types of electrical signals output by the devices to be measured 201 travel through the bumps 115b and the electrodes 115c formed at the printed board 115, are taken into the circuit board 103 via the electrodes 103c and are further sent out to the peripheral devices.

As explained above, the semiconductor device test apparatus e2 in the second embodiment achieves advantages similar to those achieved by the semiconductor device test apparatus e1 in the first embodiment.

In addition, the semiconductor device test apparatus e2 in the second embodiment which is provided with the printed board 115 to electrically connect the devices to be measured 201 and the circuit board 103 achieves a reduction in cost relative to the semiconductor device test apparatus e1 in the first embodiment provided with the film 105.

Third Embodiment

Figure 6:
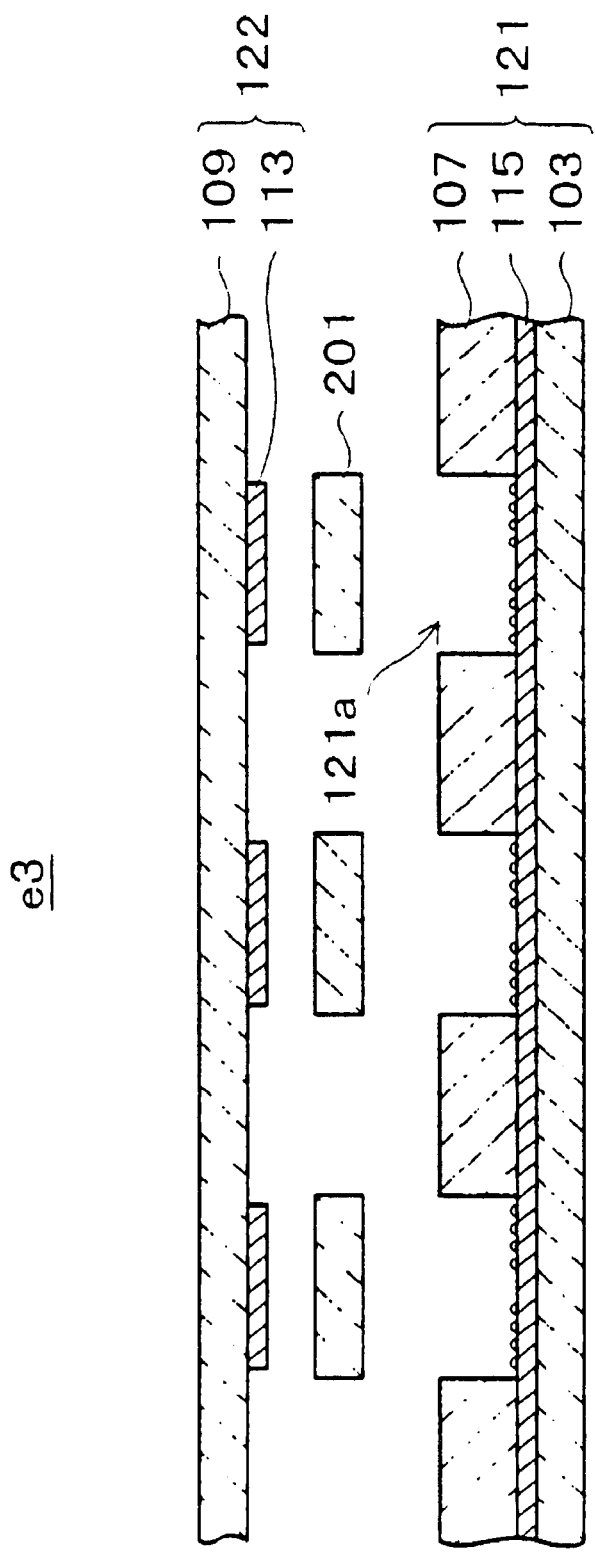
FIG. 6 is a sectional view illustrating the structure of the semiconductor test apparatus in a third embodiment.

A semiconductor device test apparatus e3 in the third embodiment of the present invention assumes a structure that includes the circuit board 103, the printed board 115, the positioning plate 107, the holding plate 109 and the buffer member 113 that constitute the semiconductor device test apparatus e2 in the second embodiment, as illustrated in FIG. 6.

However, in the semiconductor device test apparatus e3 in the third embodiment, the circuit board 103, the printed board 115 and the positioning plate 107 are integrated to constitute a first unit 121, and the holding plate 109 and the buffer member 113 are integrated to constitute a second unit 122.

When conducting a functional test on the devices to be measured 201, the devices to be measured 201 are each housed inside a device-securing portion 121a which is created by a through hole 107b at the positioning plate 107 constituting the first unit 121. The devices to be measured 201 are pressed down by the second unit 122 to be electrically connected with the printed board 115 constituting the first unit 121. In addition, since the printed board 115 is already electrically connected with the circuit board 103, electrical signals output by the peripheral devices and the source voltage are provided to the devices to be measured 201, and the electrical signals output by the devices to be measured 201 are communicated to the peripheral devices.

As explained above, the semiconductor device test apparatus e3 in the third embodiment achieves advantages similar to those achieved by the semiconductor device test apparatus e2 in the second embodiment.

In addition, since the semiconductor device test apparatus e3 in the third embodiment is constituted of the first unit 121 achieved by integrating the circuit board 103, the printed board 115 and the positioning plate 107 and the second unit 122 achieved by integrating the holding plate 109 and the buffer members 113, it is not necessary to assemble the circuit board 103, the printed board 115, the positioning plate 107, the holding plate 109 and the buffer members 113 to test the devices to be measured 201 and consequently, functional tests can be conducted on the devices to be measured by taking a procedure similar to that adopted when conducting functional tests using IC sockets in the prior art. Consequently, a higher degree of efficiency is achieved in functional tests and a reduction in the cost of the tests is achieved.

It is to be noted that in the semiconductor device test apparatus e3 in the third embodiment, the printed board 115 may be replaced by the film 105 provided in the semiconductor device test apparatus e1 in the first embodiment.

Fourth Embodiment

Figure 7:
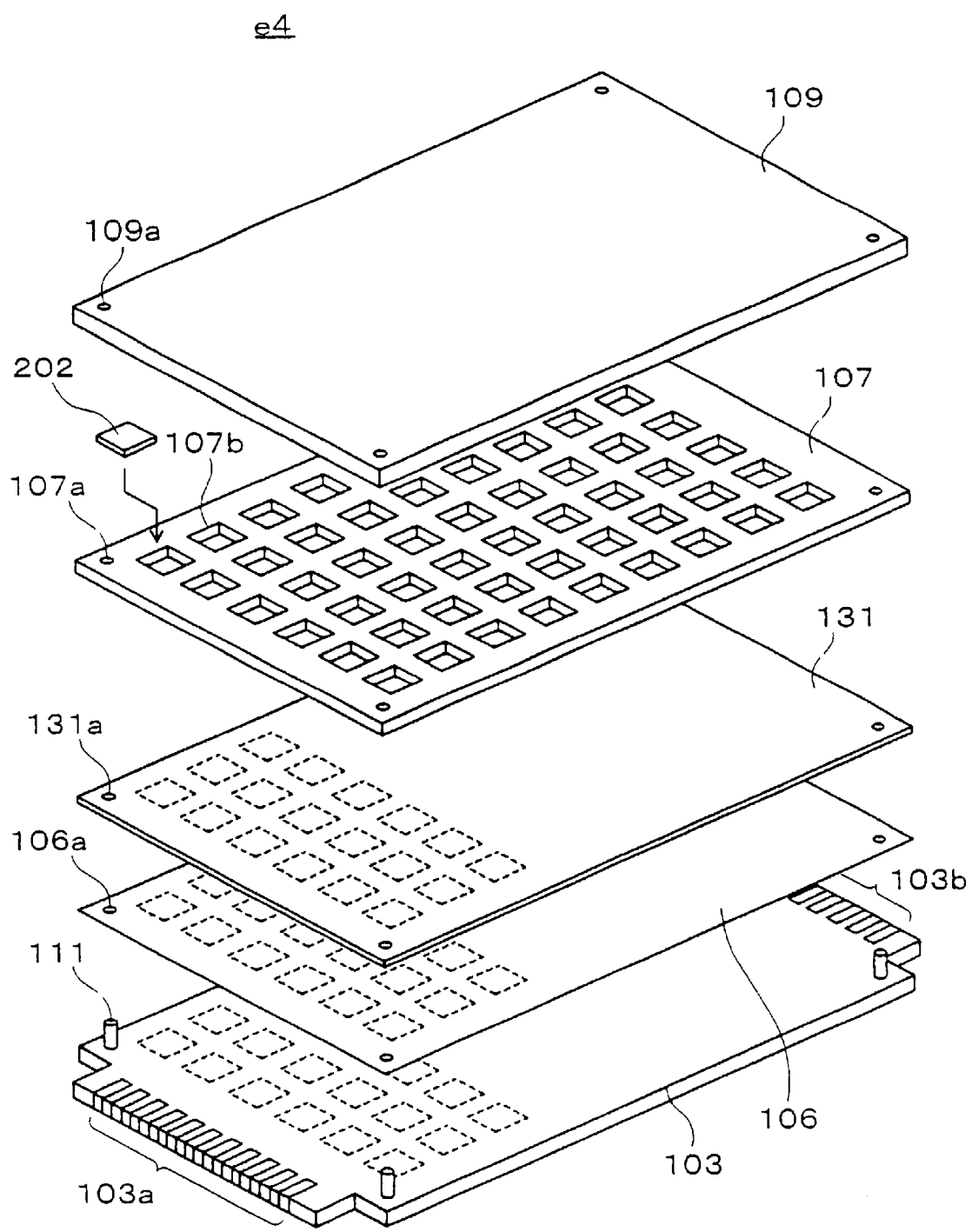
FIG. 7 is a perspective illustrating the structure of the semiconductor device test apparatus in a fourth embodiment.

A semiconductor device test apparatus e4 in the fourth embodiment of the present invention assumes a structure that includes the circuit board 103, a film 106, a rubber sheet 131, the positioning plate 107 and the holding plate 109 as illustrated in FIG. 7. Namely, the semiconductor device test apparatus e4 in the fourth embodiment assumes a structure achieved by replacing the film 105 in the semiconductor device test apparatus e1 in the first embodiment with the film 106 and by adding the rubber sheet 131.

The film 106 and the rubber sheet 131 are respectively provided with reference holes 106a and 131a at the four corners and they are secured onto the circuit board 103 together with the positioning plate 107 and the holding plate 109 by the pins 111.

It is to be noted that FIG. 7 shows a device to be measured 202. Like the devices to be measured 201 described earlier, the devices to be measured 202 are CSP devices, and in addition, they each constitute a BGA (ball grid array). The positioning plate 107 is provided with a plurality of through holes 107b constituting positioning portions to enable positioning of the devices to be measured 202. The through holes 107b are shaped to conform with the external shape of the devices to be measured 202.

Figure 8:
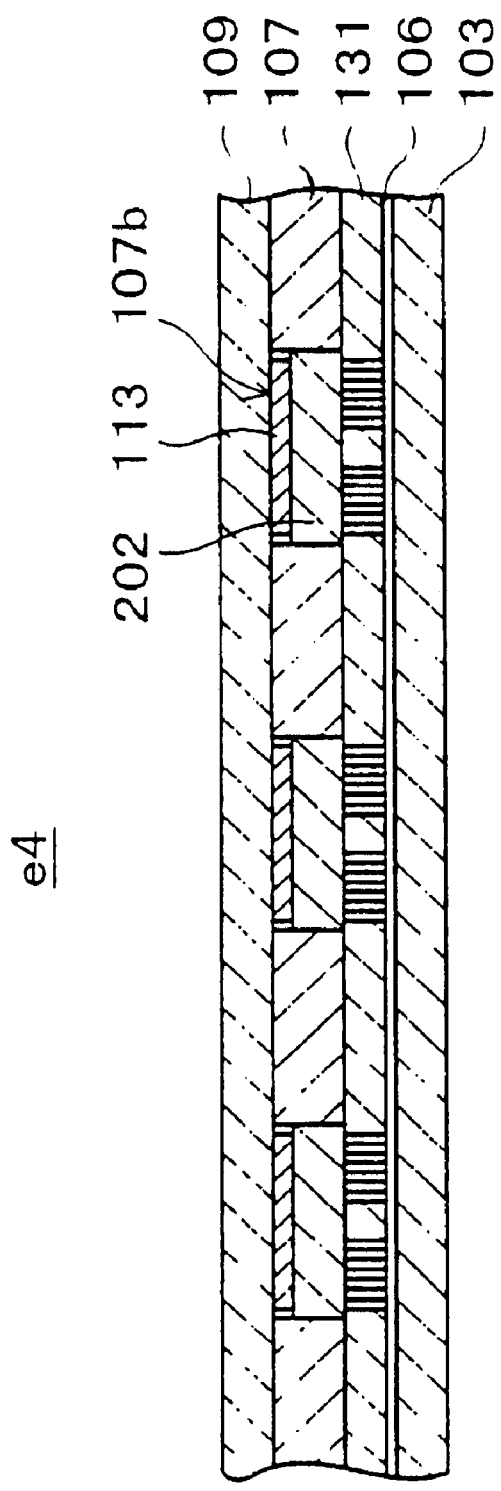
FIG. 8 is a sectional view of the semiconductor device test apparatus in FIG. 7.

FIG. 8 is a sectional view illustrating the semiconductor device test apparatus e4 in the fourth embodiment and a plurality of devices to be measured 202 fitted at the semiconductor device test apparatus e4 for the purpose of various types of functional tests. The devices to be measured 202 are each inserted at a through hole 107b at the positioning plate 107 and are held against the rubber sheet 131 by the holding plate 109. In addition, a buffer member 113 is provided between each device to be measured 202 and the holding plate 109 to ensure that the pressure from the holding plate 109 is distributed to the individual devices to be measured 202 evenly and correctly. Furthermore, the rubber sheet 131 is held against the film 106 with the pressure applied by the holding plate 109 and the film 106 is held against the circuit board 103.

Figure 9:
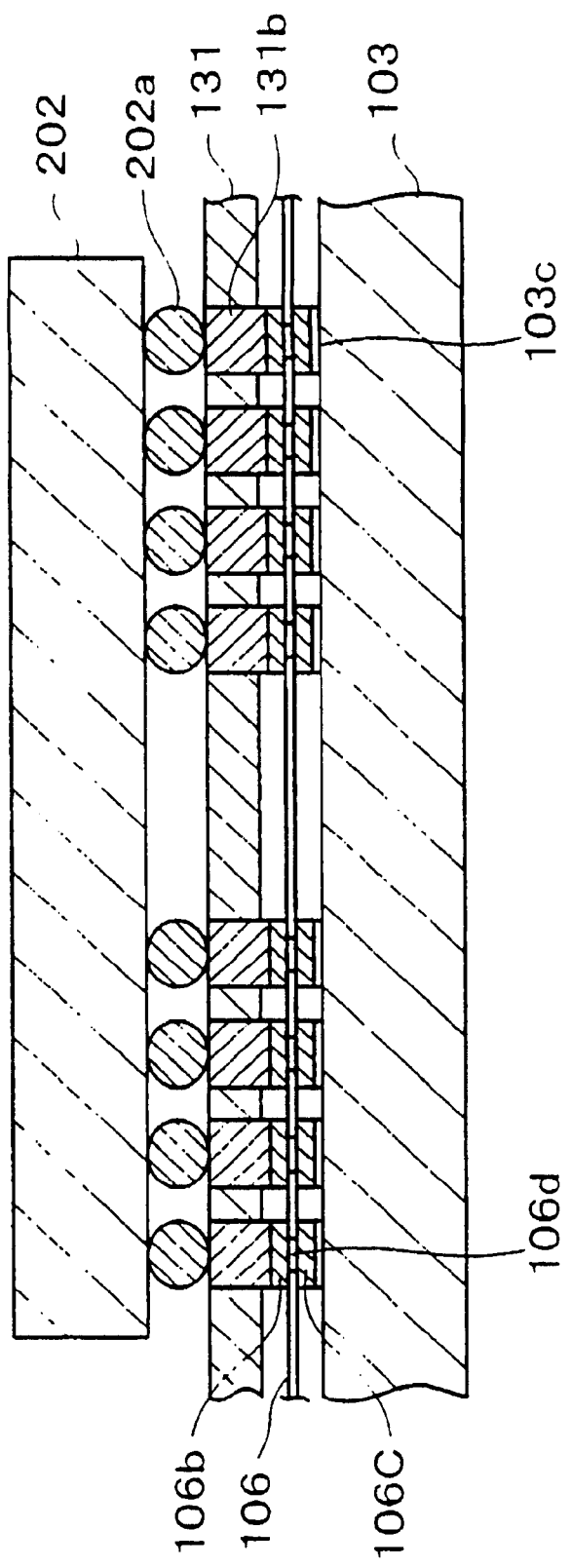
FIG. 9 is an enlargement of the sectional view of the semiconductor device test apparatus in FIG. 8.

Now, the connections among the device to be measured 202, the rubber sheet 131, the film 106 and the circuit board 103 are explained in reference to FIG. 9 which is an enlargement of FIG. 8.

The device to be measured 202 which is a BGA as explained earlier, is provided with the plurality of solder balls constituting electrodes 202a.

At the circuit board 103, a plurality of electrodes 103c are formed at positions that face opposite a plurality of electrodes 202a at the device to be measured 202.

Electrodes 106b are formed at the surface of the film 106 located toward the rubber sheet 131. At the surface of the film 106 located toward the circuit board 103, electrodes 106c are formed at positions facing opposite the plurality of electrodes 103c at the circuit board 103. The electrodes 106b and the electrodes 106c formed at different surfaces of the film 106 are electrically connected via through holes 106d.

The rubber sheet 131 is provided with anisotropic conductive rubber portions 131b at positions facing opposite the electrodes 106b at the film 106 and the electrodes 202a at the device to be measured 202.

When conducting a functional test on the devices to be measured 202, various types of electrical signals output by peripheral devices (not shown) and the source voltage are input to the circuit board 103 via the connection terminals 103a and 103b, travel through the wiring circuit formed at the circuit board 103 and reach the electrodes 103c. As illustrated in FIGS. 8 and 9, the electrodes 103c are electrically connected with the anisotropic conductive rubber portions 131b embedded in the rubber sheet 131 via the electrodes 106c and the bumps 106b formed at the film 106. In addition, the anisotropic conductive rubber portions 131b are electrically connected with the electrodes 202a formed at the devices to be measured 202. Consequently, various types of electrical signals output by the peripheral devices and the source voltage are provided to the devices to be measured 202 to electrically drive the devices to be measured 202. The various types of electrical signals output by the devices to be measured 202 travel through the anisotropic conductive rubber portions 131b embedded in the rubber sheet 131 and the electrodes 106b and 106c formed at the film 106 to be taken into the circuit board 103 via the electrodes 103c and are further sent out to the peripheral devices.

When the semiconductor device test apparatus e4 in the fourth embodiment structured as described above, which does not include any contacts formed through machining as in the IC sockets 3 in the prior art is adopted, a reduction in the pitch of the plurality of electrodes 202a formed at each device to be measured 202 can be supported, as in the case of the semiconductor test apparatus e1 in the first embodiment. For instance, even when the pitch of the electrodes 202a is equal to or less than 0.5 mm, functional tests can be conducted on the devices to be measured 202.

In addition, the semiconductor device test apparatus e4 in the fourth embodiment, which is provided with the positioning plate 107 capable of aligning the plurality of devices to be measured 202 in a batch, does not require an IC socket to be provided for each device to be measured 202. Thus, the expense of providing IC sockets is eliminated. In addition, by using the area on the circuit board 103 which is occupied by the body portion of the IC sockets in the prior art, a larger number of devices to be measured 202 can be mounted at the circuit board 103 so that even more devices to be measured can be tested in a single functional test.

It is to be noted that it is necessary to take into consideration a possible deformation of the ball-shaped electrodes when conducting various types of functional tests on BGAs such as the devices to be measured 202. In the case of the semiconductor device test apparatus in the fourth embodiment, which is provided with the rubber sheet 131 that achieves elasticity and at the same time enables electrical connection only in the thicknesswise direction, the electrodes 202a formed at the devices to be measured 202 do not become deformed. The anisotropic conductive rubber portions 131b provided at the rubber sheet 131 come in contact with the ball-shaped electrodes 202a provided at the devices to be measured 202 over a larger area due to their elasticity. Thus, when the semiconductor device test apparatus e4 in the fourth embodiment is employed, the individual devices to be measured 202 achieve reliable electrical connection with the peripheral devices to enable functional tests to be performed with a higher degree of accuracy.

Fifth Embodiment

Figure 10:
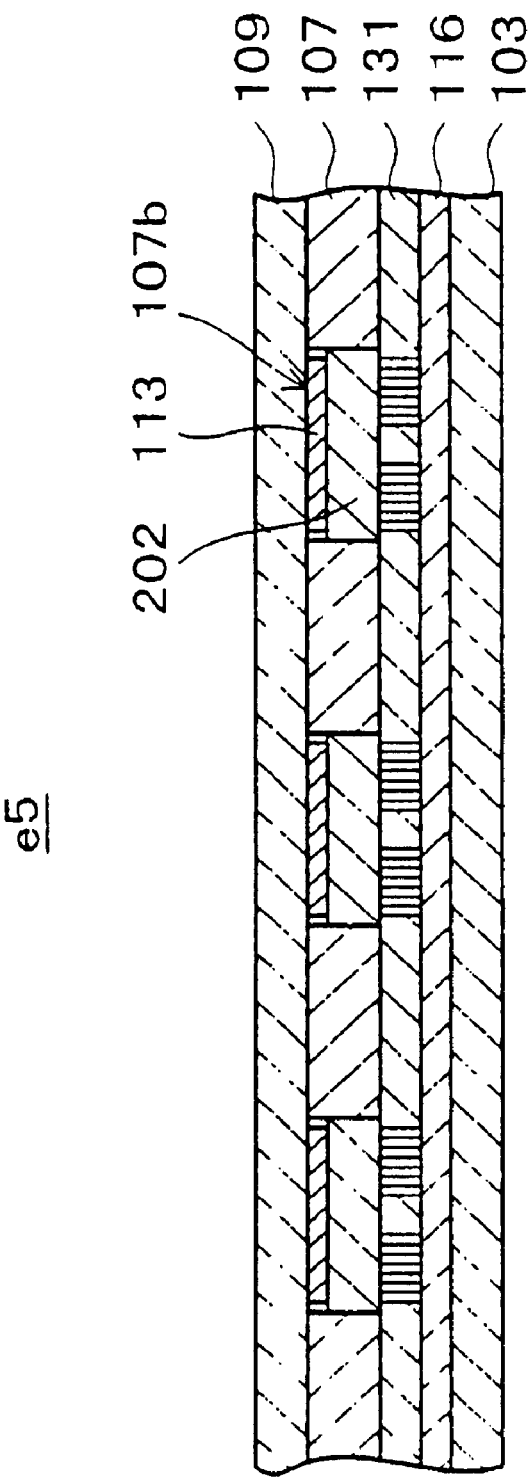
FIG. 10 is a sectional view illustrating the structure of the semiconductor test apparatus in the fifth embodiment.

FIG. 10 is a sectional view illustrating a semiconductor device test apparatus e5 in the fifth embodiment of the present invention and a plurality of devices to be measured 202 that are fitted at the semiconductor device test apparatus e5 for the purpose of various types of functional tests. The semiconductor device test apparatus e5 in the fifth embodiment adopts a structure which is achieved by replacing the film 106 in the semiconductor device test apparatus e4 in the fourth embodiment with a printed board 116, as illustrated in FIG. 10.

The devices to be measured 202 are each inserted at a through hole 107b at the positioning plate 107 and are held against the rubber sheet 131 by the holding plate 109. In addition, a buffer member 113 is provided between each device to be measured 202 and the holding plate 109 to ensure that the pressure from the holding plate 109 is distributed to the individual devices to be measured 202 evenly and correctly. Furthermore, the rubber sheet 131 is held against the printed board 116 with the pressure applied by the holding plate 109 and the printed board 116 is held against the circuit board 103.

Figure 11:
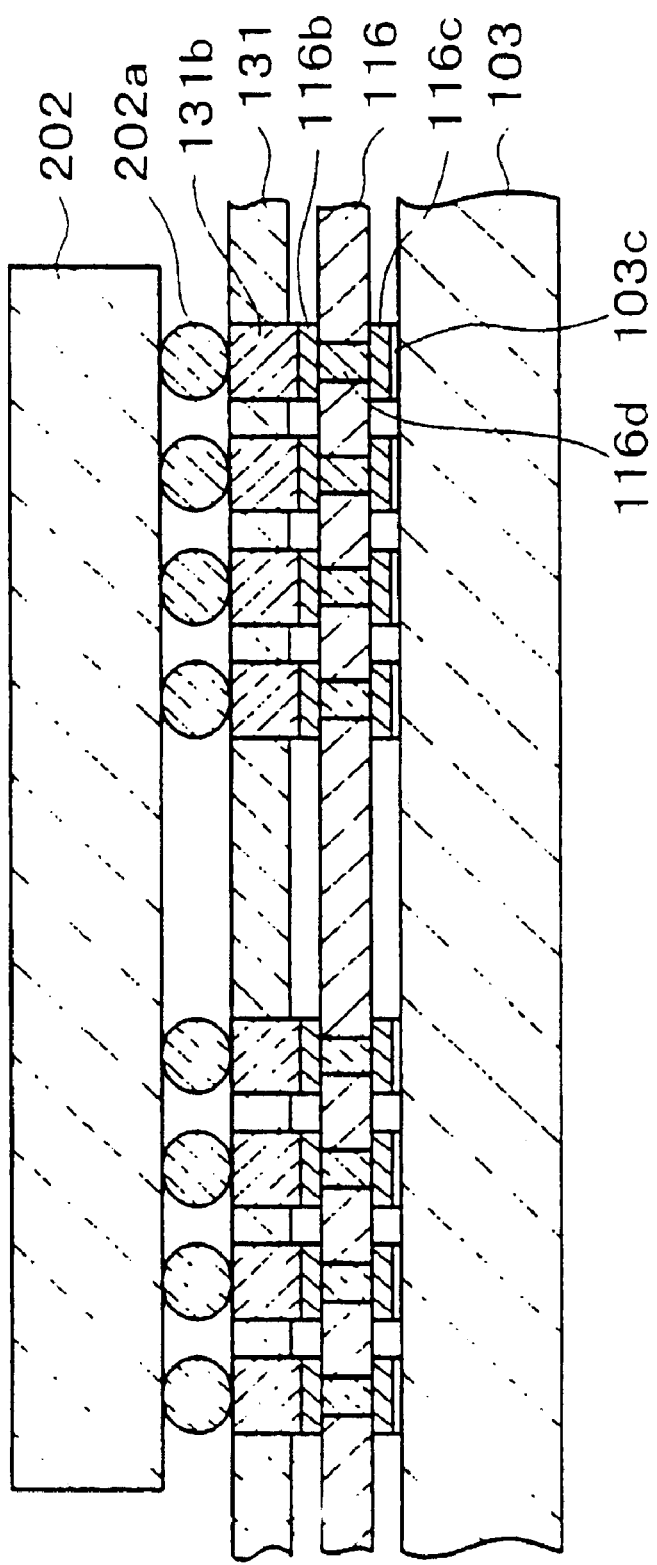
FIG. 11 is an enlargement of the sectional view of the semiconductor device test apparatus in FIG. 10.

Now, the connections among the device to be measured 202, the rubber sheet 131, the printed board 116 and the circuit board 103 are explained in reference to FIG. 11 which is an enlargement of FIG. 10.

Electrodes 116b are formed at the surface of the printed board 116 located toward the rubber sheet 131. At the surface of the printed board 116 located toward the circuit board 103, electrodes 116c are formed at positions facing opposite the plurality of electrodes 103c at the circuit board 103. The electrodes 116b and the electrodes 116c formed at different surfaces of the printed board 116 are electrically connected via through holes 116d.

The rubber sheet 131 is provided with anisotropic conductive rubber portions 131b at positions facing opposite the electrodes 116b at the printed board 116 and the electrodes 202a at the device to be measured 202.

When conducting a functional test on the devices to be measured 202, various types of electrical signals output by peripheral devices (not shown) and the source voltage are input to the circuit board 103 via the connection terminals 103a and 103b, travel through the wiring circuit formed at the circuit board 103 and reach the electrodes 103c. As illustrated in FIGS. 10 and 11, the electrodes 103c are electrically connected with the anisotropic conductive rubber portions 131b embedded in the rubber sheet 131 via the electrodes 116c and the electrodes 116b formed at the printed board 116. In addition, the anisotropic conductive rubber portions 131b are electrically connected with the electrodes 202a formed at the devices to be measured 202. Consequently, various types of electrical signals output by the peripheral devices and the source voltage are provided to the devices to be measured 202 to electrically drive the devices to be measured 202. In addition, the various types of electrical signals output by the devices to be measured 202 travel through the anisotropic conductive rubber portions 131b embedded in the rubber sheet 131 and the electrodes 116b and 116c formed at the printed board 116 to be taken into the circuit board 103 via the electrodes 103c and are further sent out to the peripheral devices.

As explained above, the semiconductor device test apparatus e5 in the fifth embodiment achieves advantages similar to those achieved by the semiconductor device test apparatus e4 in the fourth embodiment.

In addition, with the semiconductor device test apparatus e5 in the fifth embodiment which is provided with the printed board 116 to achieve electrical connection between the devices to be measured 202 and the circuit board 103, a reduction in the production cost is achieved compared to the semiconductor device test apparatus e4 in the fourth embodiment provided with the film 106.

Sixth Embodiment

Figure 12:
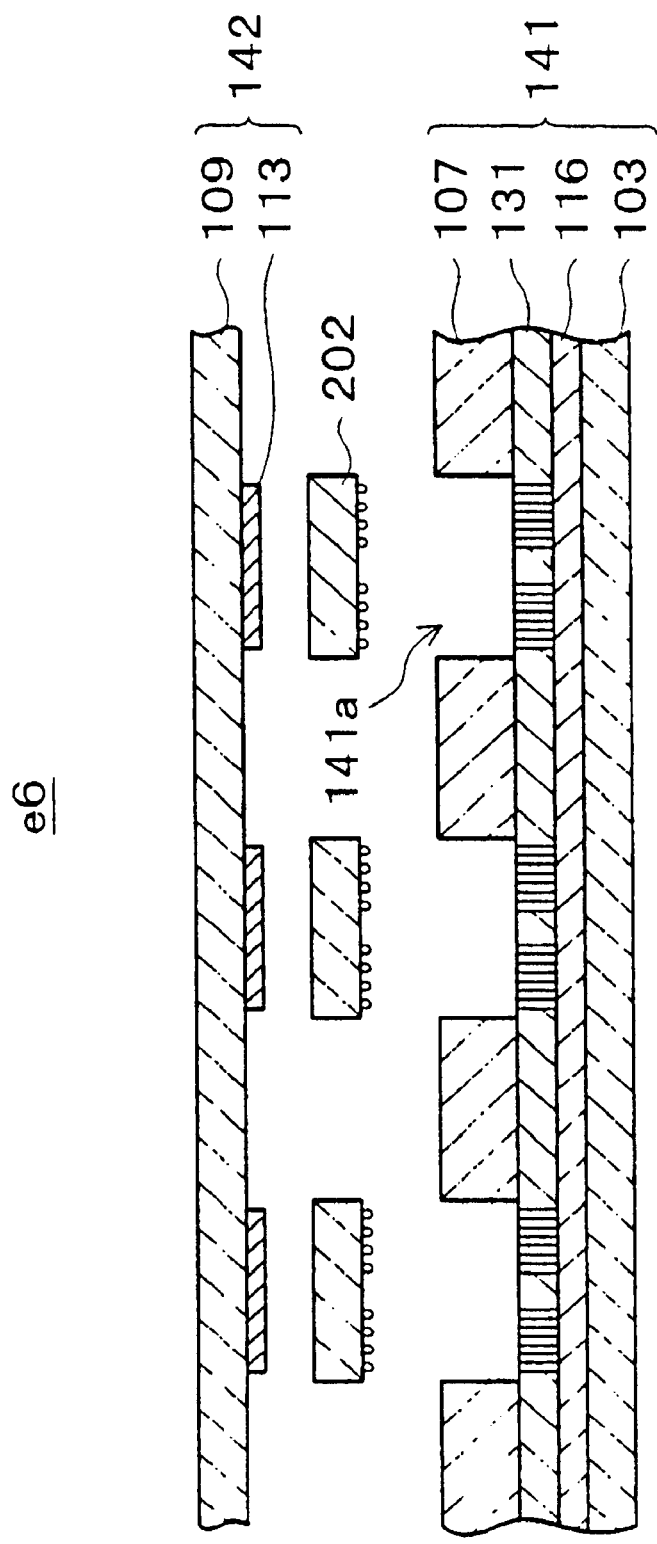
FIG. 12 is a sectional view illustrating the structure of the semiconductor test apparatus in the sixth embodiment.

A semiconductor device test apparatus e6 in the sixth embodiment of the present invention assumes a structure that includes the circuit board 103, the printed board 116, the rubber sheet 131, the positioning plate 107, the holding plate 109 and the buffer members 113 that constitute the semiconductor device test apparatus e5 in the fifth embodiment, as illustrated in FIG. 12.

However, in the semiconductor device test apparatus e6 in the sixth embodiment, the circuit board 103, the printed board 116, the rubber sheet 131 and the positioning plate 107 are integrated to constitute a first unit 141, and the holding plate 109 and the buffer members 113 are integrated to constitute a second unit 142.

When conducting a functional test on the devices to be measured 202, the devices to be measured 202 are each housed inside a device-securing portion 141a which is created by a through hole 107b at the positioning plate 107 constituting the first unit 141. The devices to be measured 202 are pressed down by the second unit 142 to be electrically connected with the rubber sheet 131 constituting the first unit 141. In addition, since the rubber sheet 131 is already electrically connected with the printed board 116 and the printed board 116 is already electrically connected with the circuit board 103, consequently, the electrical signals output by the peripheral devices and the source voltage are provided to the devices to be measured 202, and the electrical signals output by the devices to be measured 202 are communicated to the peripheral devices.

As explained above, the semiconductor device test apparatus e6 in the sixth embodiment achieves advantages similar to those achieved by the semiconductor device test apparatus e5 in the fifth embodiment.

In addition, since the semiconductor device test apparatus e6 in the sixth embodiment is constituted of the first unit 141 achieved by integrating the circuit board 103, the printed board 116, the rubber sheet 131 and the positioning plate 107 and the second unit 142 achieved by integrating the holding plate 109 and the buffer members 113, it is not necessary to assemble the circuit board 103, the printed board 116, the rubber sheet 131, the positioning plate 107, the holding plate 109 and the buffer members 113 to test the devices to be measured 202 and consequently, functional tests can be conducted on the devices to be measured 202 by taking a procedure similar to that adopted when conducting functional tests using IC sockets in the prior art. Consequently, a higher degree of efficiency is achieved in functional tests and a reduction in the cost of the tests is achieved.

It is to be noted that in the semiconductor device test apparatus e6 in the sixth embodiment, the printed board 116 may be replaced by the film 106 provided in the semiconductor device test apparatus e4 in the fourth embodiment.

Seventh Embodiment

Figure 13:
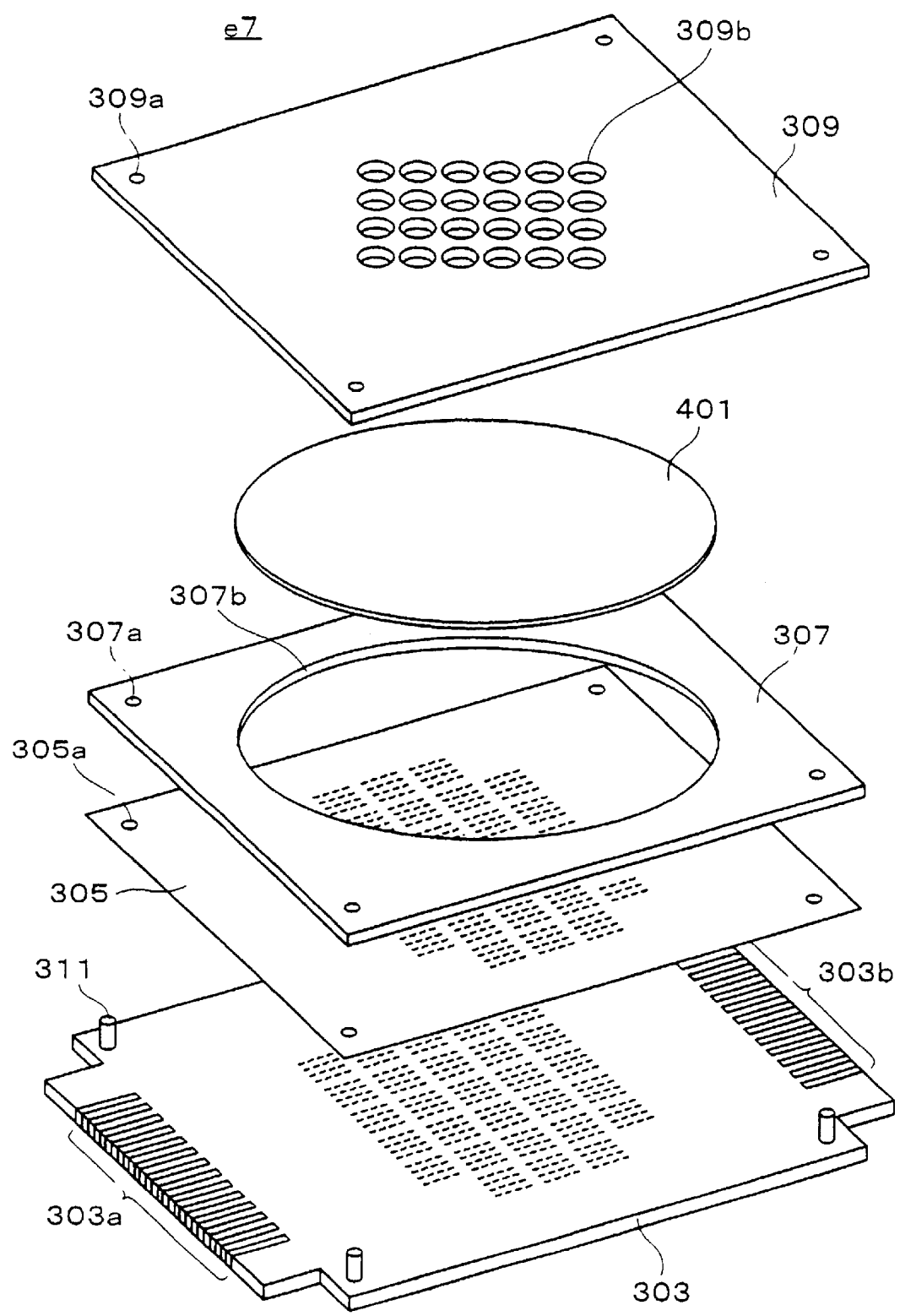
FIG. 13 is a perspective illustrating the structure of the semiconductor device test apparatus in a seventh embodiment.

As illustrated in FIG. 13, a semiconductor device test apparatus e7 in the seventh embodiment of the present invention assumes a structure that includes a circuit board 303, a film 305, a positioning plate 307 and a holding plate 309.

The circuit board 303 is connected to peripheral devices (not shown) through connection terminals 303a and 303b to enable input and output of various types of electrical signals and a source voltage. The circuit board 303 may be constituted of, for instance, a multilayer substrate.

The film 305, the positioning plate 307 and the holding plate 309 are respectively provided with reference holes 305a, 307a and 309a at the four corners, and are secured onto the circuit board 303 with pins 311.

The positioning plate 307 is provided with a through hole 307b constituting a positioning member to enable positioning of a wafer to be measured 401. The through hole 307b is formed in a shape that conforms with the external shape of the wafer to be measured 401.

A plurality of ventilating through holes 309b are formed at the holding plate 309. This makes it possible to expose the wafer to be measured 401 to the air that circulates through convection when, for instance, a burn-in is implemented on the wafer to be measured 401. It is to be noted that for applications other than burn-in, the ventilating through holes 309b may be omitted.

Figure 14A:
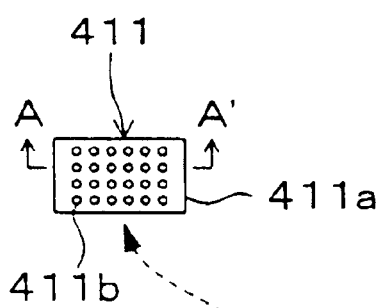
FIG. 14A and FIG. 14B are plan views of a wafer to be measured that may be tested by the semiconductor device test apparatus illustrated in FIG. 13.
Figure 14B:
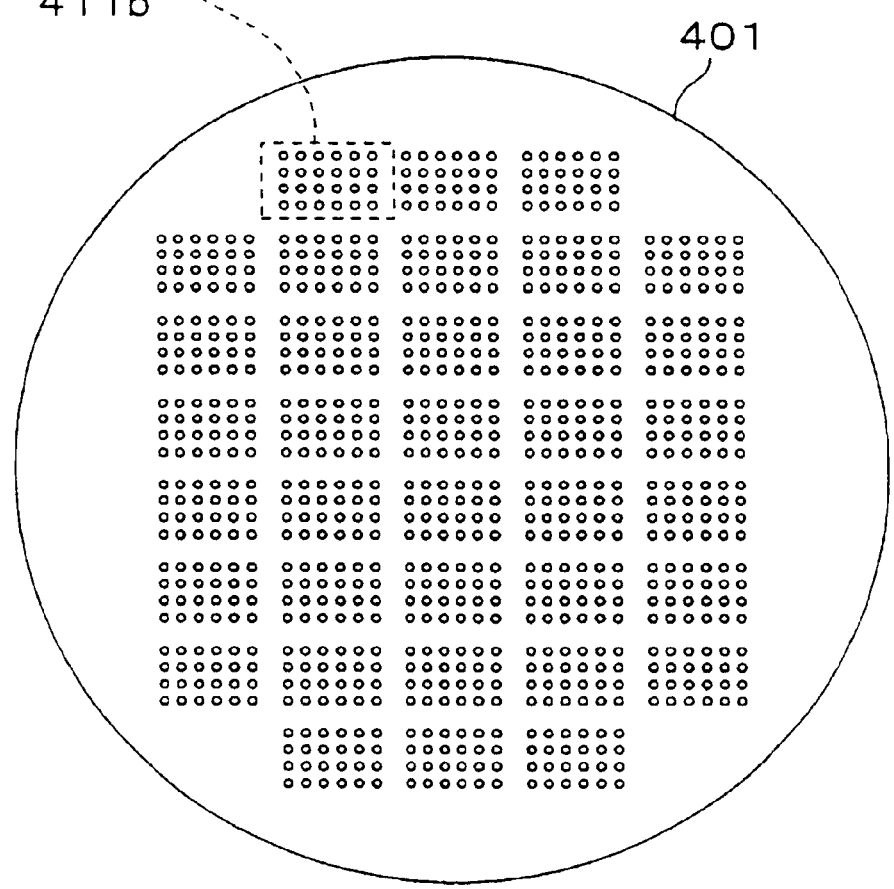

Now, the wafer to be measured 401, which is to undergo various types of functional tests conducted by using the semiconductor device test apparatus e7 in the seventh embodiment is explained in reference to FIG. 14.

Figure 15:
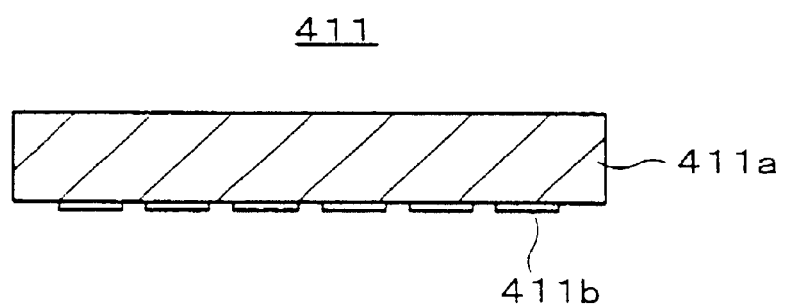
FIG. 15 is a sectional view of a CSP device obtained from the wafer to be measured in FIG. 14.

The wafer to be measured 401 is resin-coated and is ultimately divided into a plurality of CSP devices 411. FIG. 15 is a sectional view of a CSP device 411 along line A–A' in FIG. 14. A plurality of electrodes 411b are provided at the surface of a device body 411a. The electrodes 411b are land type (LGA) electrodes with flat surfaces.

Figure 16:
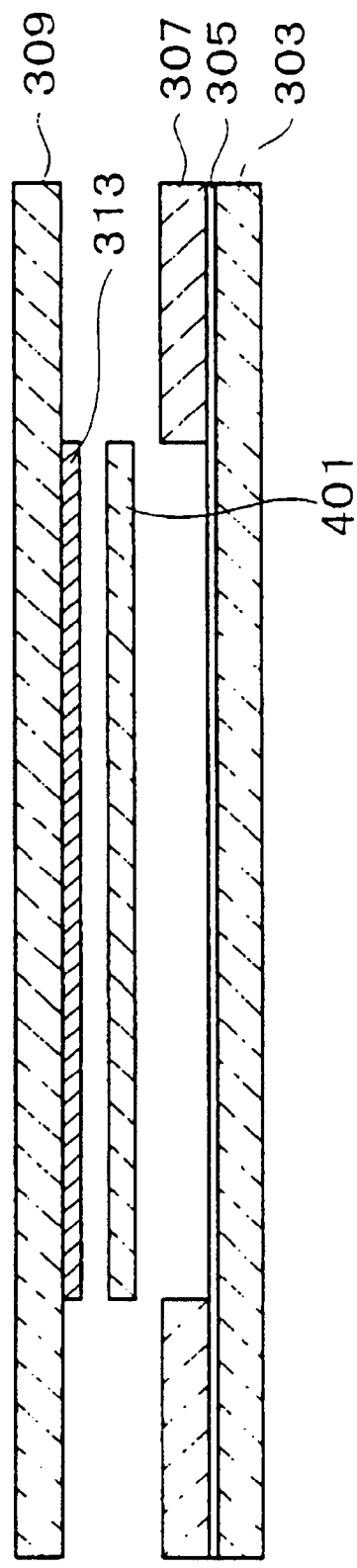
FIG. 16 is a sectional view illustrating the semiconductor device test apparatus in FIG. 13 immediately before the wafer to be measured in FIG. 14 is fitted.

FIG. 16 is a sectional view illustrating the semiconductor device test apparatus e7 in the seventh embodiment and the wafer to be measured 401 immediately before the wafer to be measured 401 is mounted at the semiconductor device test apparatus e7 for the purpose of various types of functional tests. A buffer member 313 is provided at the holding plate 309 at a position that faces opposite the wafer to be measured 401. In addition, it is desirable to pre-assemble the circuit board 303, the film 305 and the positioning plate 307 to achieve an integrated assembly, as illustrated in FIG. 16.

Figure 17:
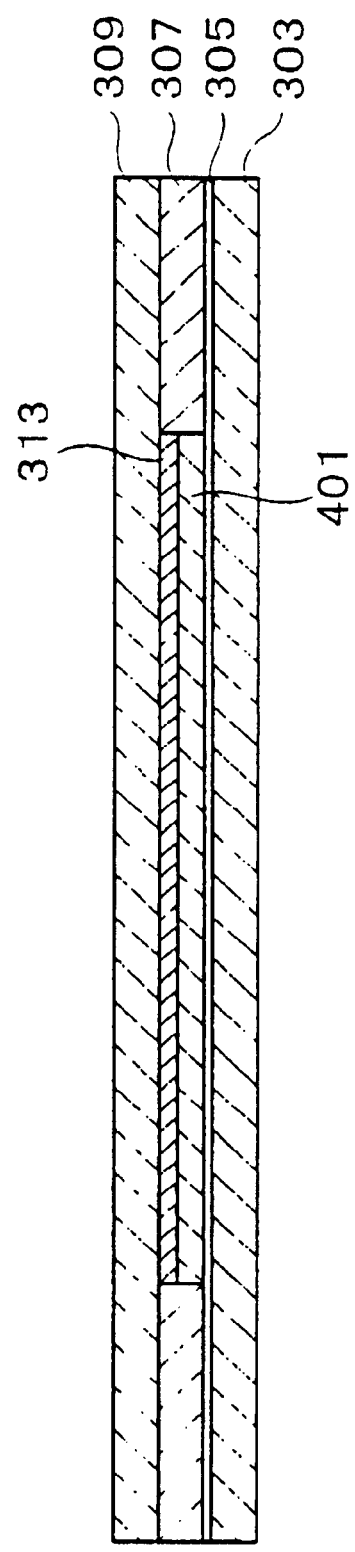
FIG. 17 is a sectional view illustrating the semiconductor device test apparatus in FIG. 13 with the wafer to be measured in FIG. 14 fitted.

Then, the wafer to be measured 401 is mounted at the semiconductor device test apparatus e7 in the seventh embodiment as illustrated in FIG. 17. The wafer to be measured 401 is inserted at the through hole 307b at the positioning plate 307 and is pressed against the film 305 by the holding plate 309. The pressure from the holding plate 309 is distributed evenly and correctly to the wafer to be measured 401 by the buffer member 313 provided at the holding plate 309. In addition, the film 305 is held onto the circuit board 303 by the pressure from the holding plate 309.

Figure 18:
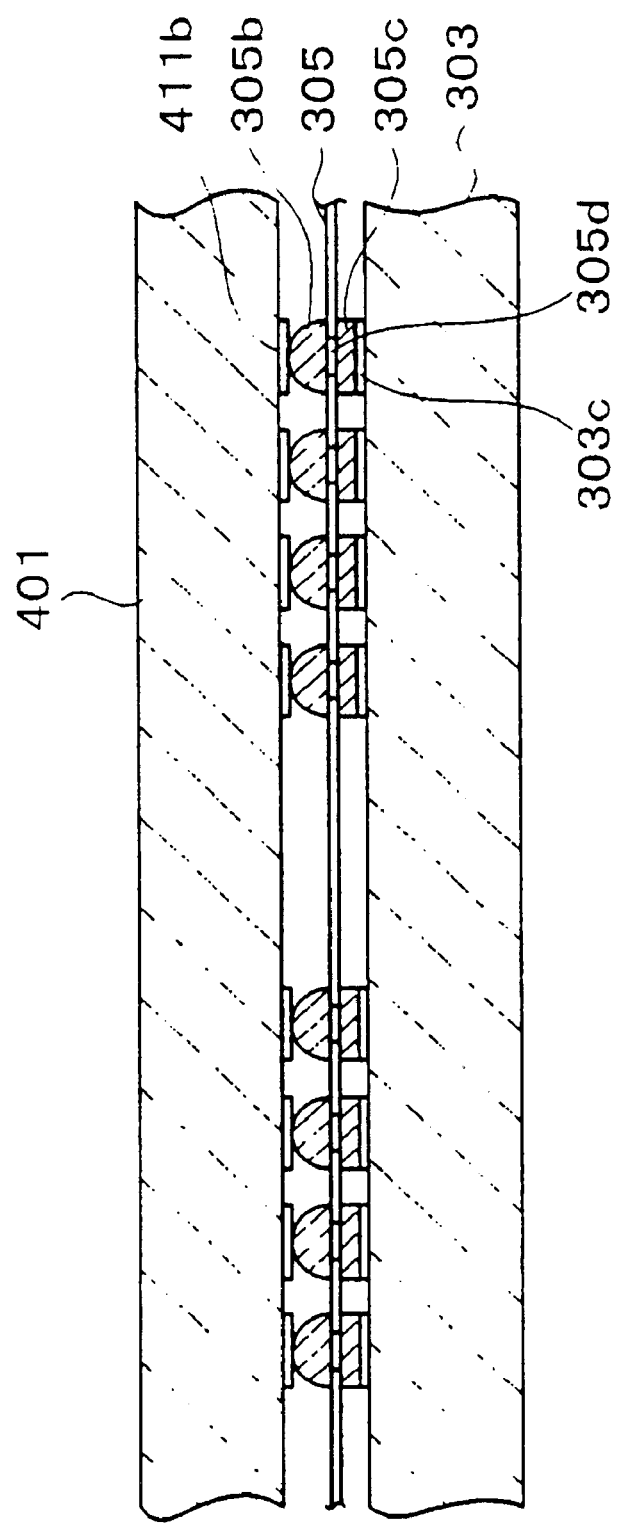
FIG. 18 is an enlargement of the sectional view of the semiconductor device test apparatus in FIG. 17.

Now, the connections among the wafer to be measured 401, the film 305 and the circuit board 303 are explained in reference to FIG. 18 which is an enlargement of FIG. 17.

At the circuit board 303, a plurality of electrodes 303c are formed at positions that face opposite the plurality of electrodes 411b at the wafer to be measured 401.

Bumps 305b are formed at the surface of the film 305 located toward the wafer to be measured 401, at positions that face opposite the plurality of electrodes 411b at the wafer to be measured 401. These bumps 305b, which are terminals capable of supplying source voltage and inputting/outputting various types of electrical signals, are each formed in a semi-spherical shape through electrolytic plating. They may be constituted of, for instance, copper, with their surfaces processed in a gold plating treatment. Alternatively, instead of the bumps, projections may be formed through etching.

Electrodes (lands) 305c are formed at the surface of the film 305 located toward the circuit board 303, at positions facing opposite the plurality of electrodes 303c at the circuit board 303. The bumps 305b and the electrodes 305c formed at different surfaces of the film 305 are electrically connected via through holes 305d.

When conducting a functional test on the wafer to be measured 401, various types of electrical signals output by peripheral devices (not shown) and the source voltage are input to the circuit board 303 via the connection terminals 303a and 303b, travel through the wiring circuit formed at the circuit board 303 and reach the electrodes 303c. As illustrated in FIGS. 17 and 18, the electrodes 303c are electrically connected with the electrodes 411b formed at the wafer to be measured 401 via the electrodes 305c and the bumps 305b formed at the film 305. Consequently, various types of electrical signals output by the peripheral devices and the source voltage are provided to the wafer to be measured 401 to electrically drive the wafer to be measured 401. In addition, the various types of electrical signals output by the wafer to be measured 401 travel through the bumps 305b and the electrodes 305c formed at the film 305, are taken into the circuit board 303 via the electrodes 303c and are further sent out to the peripheral devices.

When the semiconductor device test apparatus e7 in the seventh embodiment structured as described above, which does not include any contacts formed through machining as in the IC sockets 3 in the prior art is adopted, a reduction in the pitch of the plurality of electrodes 411b formed at the wafer to be measured 401 can be supported. For instance, even when the pitch of the electrodes 411b is equal to or less than 0.5 mm, functional tests can be conducted on the wafer to be measured 401.

In addition, the semiconductor device test apparatus e7 in the seventh embodiment enables various types of functional tests to be conducted at the wafer level without dividing the wafer into chips. Thus, the necessity for providing IC sockets for individual chips is eliminated to eliminate the cost of IC sockets.

Furthermore, by fitting the semiconductor device test apparatus e7 in the seventh embodiment, which supports resin-coated CSP level wafers, at a test/monitor burn-in apparatus in the prior art, it becomes possible to conduct batch tests/burn-ins.

It is to be noted that while the film 305 is provided in the semiconductor device test apparatus e7 in the seventh embodiment, a printed board may be utilized instead.

Eighth Embodiment

Figure 19:
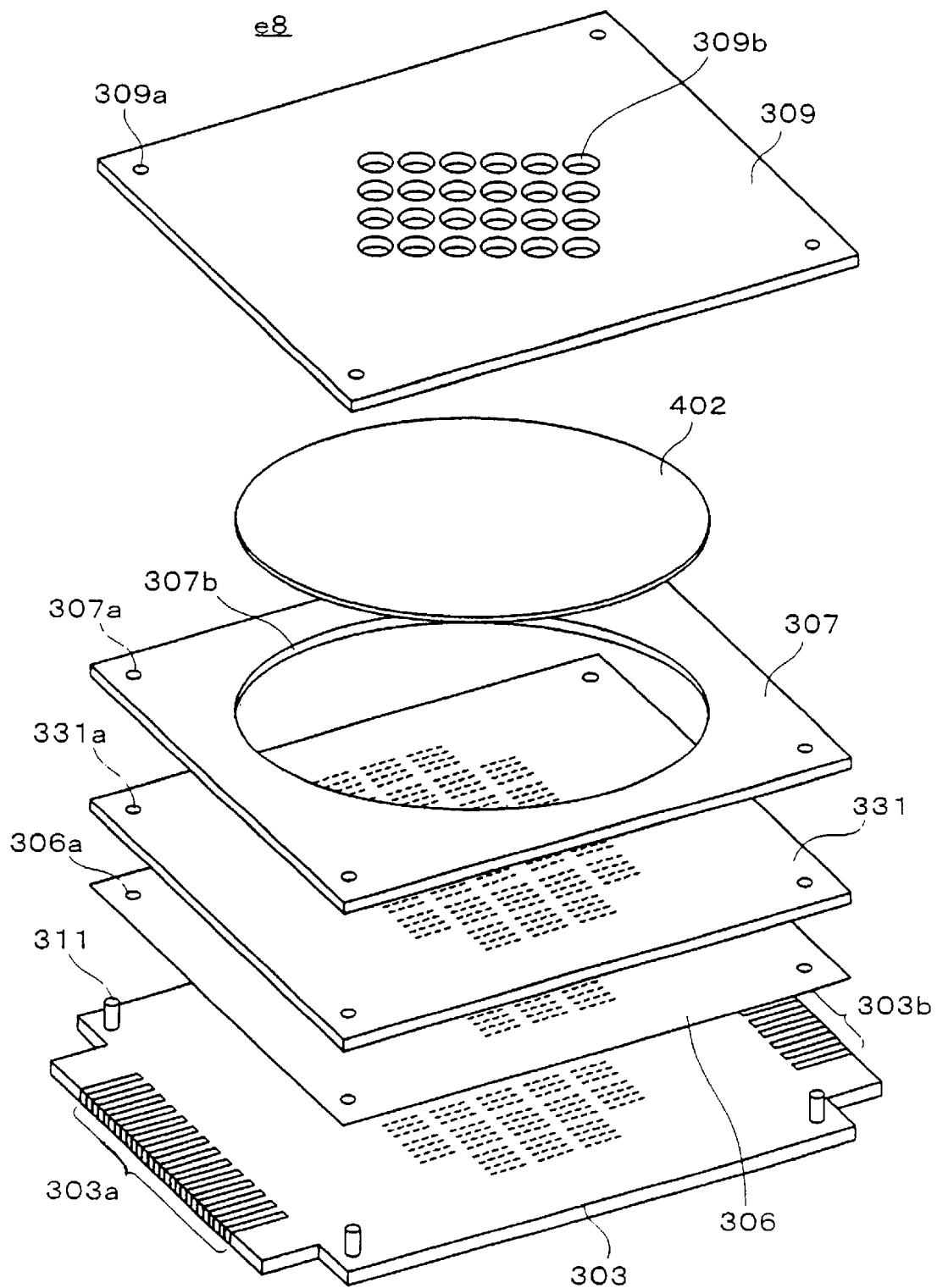
FIG. 19 is a perspective illustrating the structure of the semiconductor device test apparatus in an eighth embodiment.

A semiconductor device test apparatus e8 in the eighth embodiment of the present invention assumes a structure that includes the circuit board 303, a film 306, a rubber sheet 331, the positioning plate 307 and the holding plate 309 as illustrated in FIG. 19. In other words, the semiconductor device test apparatus e8 in the eighth embodiment assumes a structure achieved by replacing the film 305 in the semiconductor device test apparatus e7 in the seventh embodiment with the film 306 and adding the rubber sheet 331.

The film 306 and the rubber sheet 331 are respectively provided with reference holes 306a and 331a at the four corners and they are secured onto the circuit board 303 together with the positioning plate 307 and the holding plate 309 by the pins 311.

The positioning plate 307 is provided with a through hole 307b constituting a positioning member to enable positioning of a wafer to be measured 402. The through hole 307b is formed in a shape that conforms with the external shape of the wafer to be measured 402.

Figure 20A:
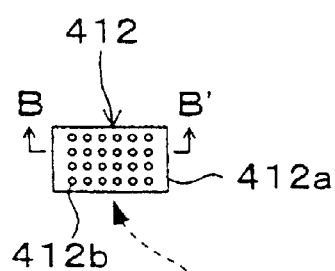
FIG. 20A and FIG. 20B are plan views of a wafer to be measured that may be tested by the semiconductor device test apparatus illustrated in FIG. 19.
Figure 20B:
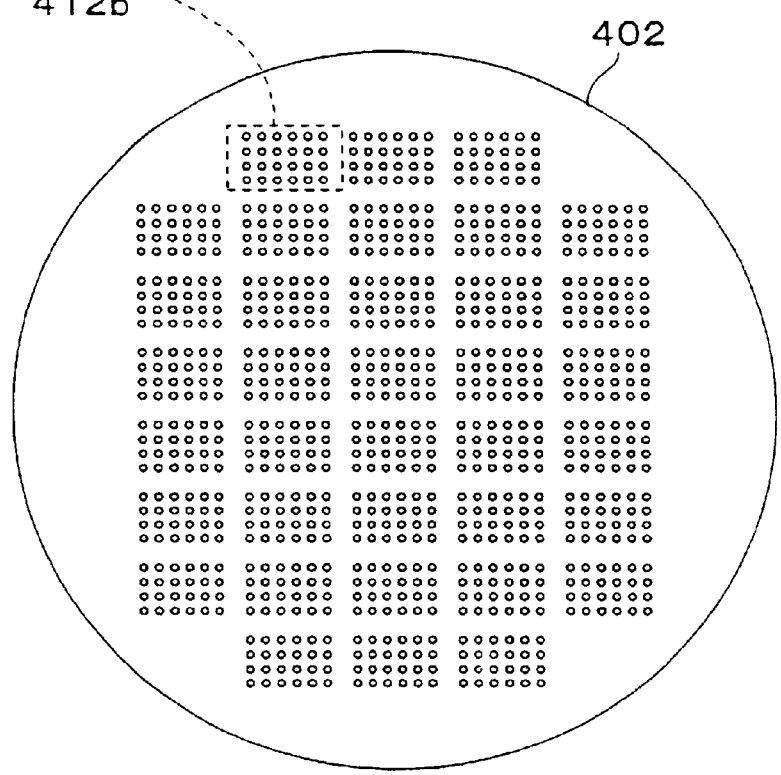

Now, the wafer to be measured 402, which is to undergo various types of functional tests conducted by using the semiconductor device test apparatus e8 in the eighth embodiment is explained in reference to FIG. 20.

Figure 21:
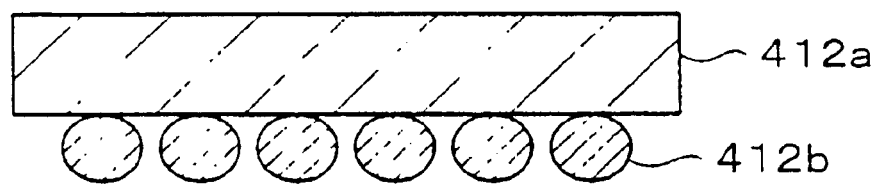
FIG. 21 is a sectional view of a CSP device obtained from the wafer to be measured in FIG. 20.

The wafer to be measure 402 is resin-coated and is ultimately divided into a plurality of CSP devices 412, as in the case of the wafer to be measured 401 in the previous embodiment. FIG. 21 is a sectional view of a CSP device 412 along line B–B' in FIG. 20. A plurality of electrodes 412b are provided at the surface of a device body 412a. The electrodes 412b are ball-type electrodes, and the CSP devices 412 are formed as BGAs.

Figure 22:
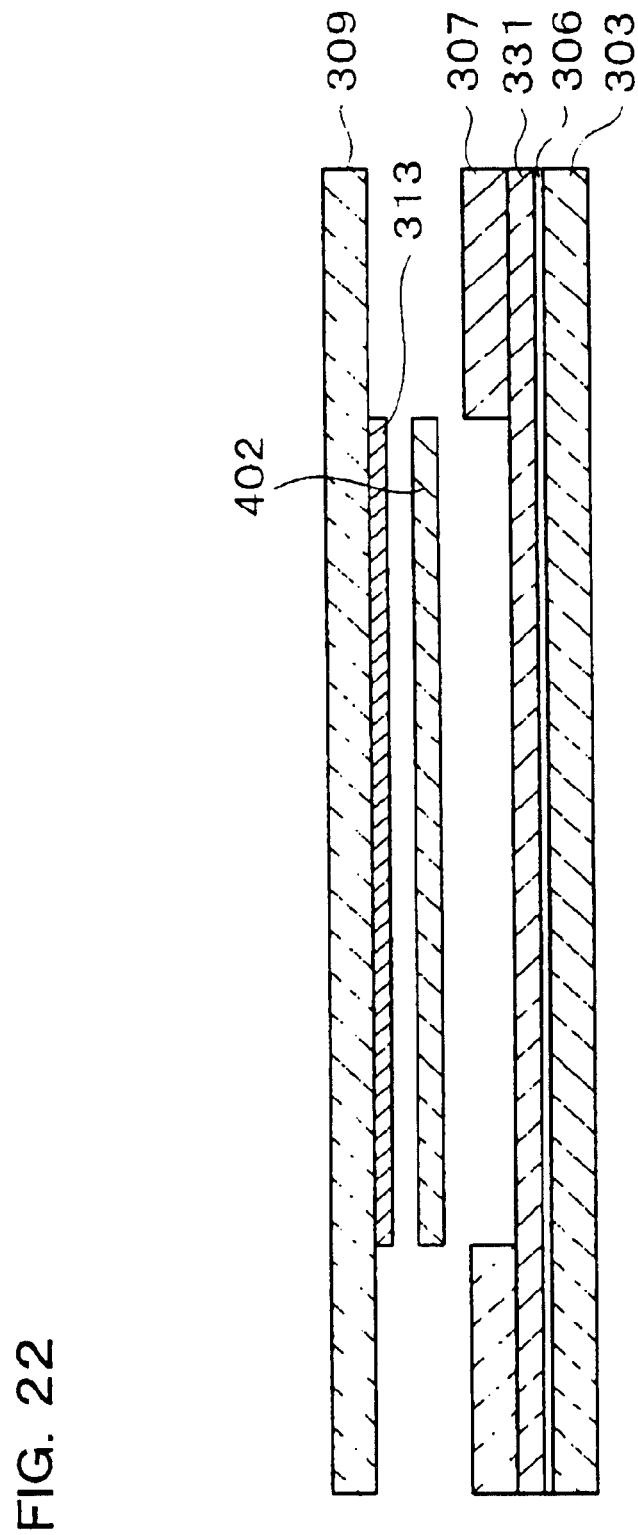
FIG. 22 is a sectional view illustrating the semiconductor device test apparatus in FIG. 19 immediately before the wafer to be measured in FIG. 20 is fitted.

FIG. 22 is a sectional view illustrating the semiconductor device test apparatus e8 in the eighth embodiment and the wafer to be measured 402 immediately before the wafer to be measured 402 is mounted at the semiconductor device test apparatus e8 for the purpose of various types of functional tests. A buffer member 313 is provided at the holding plate 309 at a position that faces opposite the wafer to be measured 402. In addition, it is desirable to pre-assemble the circuit board 303, the film 306, the rubber sheet 331 and the positioning plate 307 to achieve an integrated assembly, as illustrated in FIG. 22.

Figure 23:
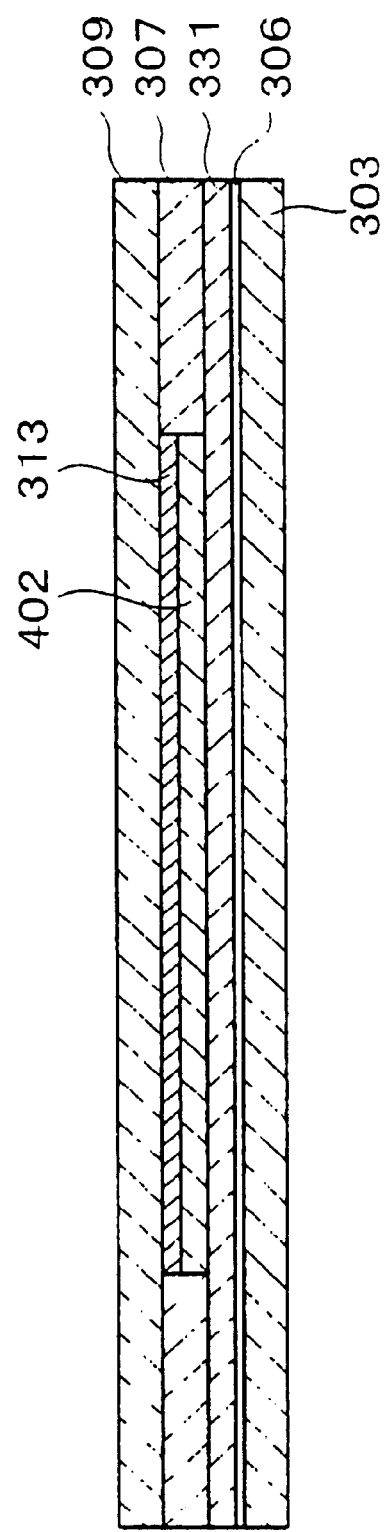
FIG. 23 is a sectional view illustrating the semiconductor device test apparatus in FIG. 19 with the wafer to be measured in FIG. 20 fitted.

Then, the wafer to be measured 402 is fitted at the semiconductor device test apparatus e8 in the eighth embodiment as illustrated in FIG. 23. The wafer to be measured 402 is inserted at the through hole 307b at the positioning plate 307 and is held against the rubber sheet 331 by the holding plate 309. The pressure from the holding plate 309 is distributed evenly and correctly to the wafer to be measured 402 by the buffer member 313 provided at the holding plate 309. Furthermore, the rubber sheet 331 is held against the film 306 with the pressure applied by the holding plate 309 and the film 306 is held against the circuit board 303.

Figure 24:
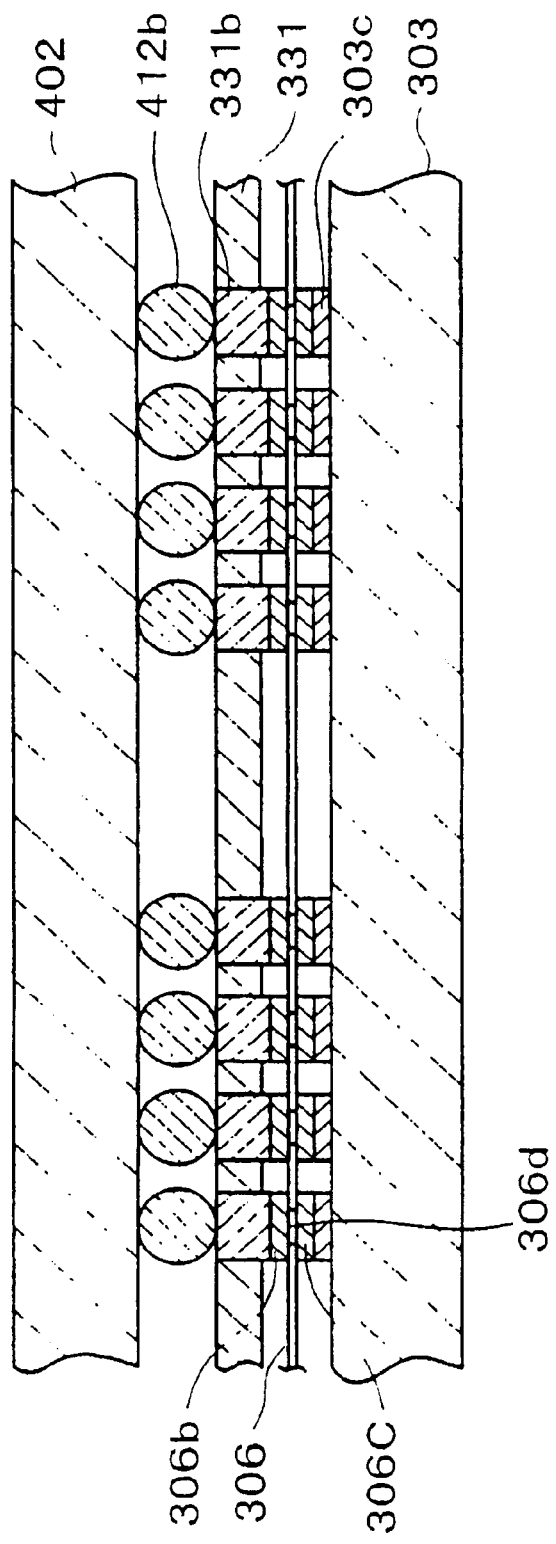
FIG. 24 is an enlargement of the sectional view of the semiconductor device test apparatus in FIG. 23.

Now, the connections among the wafer to be measured 402, the rubber sheet 331, the film 306 and the circuit board 303 are explained in reference to FIG. 24 which is an enlargement of FIG. 23.

The wafer to be measured 402, which is a BGA as explained earlier, is provided with a plurality of solder balls constituting electrodes 412b.

At the circuit board 303, a plurality of electrodes 303c are formed at positions that face opposite a plurality of electrodes 412b at the wafer to be measured 402.

Electrodes 306b are formed at the surface of the film 306 located toward the rubber sheet 331. At the surface of the film 306 located toward the circuit board 303, electrodes 306c are formed at positions facing opposite the plurality of electrodes 303c at the circuit board 303. The electrodes 306b and the electrodes 306c formed at different surfaces of the film 306 are electrically connected via through holes 306d.

The rubber sheet 331 is provided with anisotropic conductive rubber portions 331b at positions facing opposite the electrodes 306b at the film 306 and the electrodes 412b at the wafer to be measured 402.

When conducting a functional test on the wafer to be measured 402, various types of electrical signals output by peripheral devices (not shown) and the source voltage are input to the circuit board 303 via the connection terminals 303a and 303b, travel through the wiring circuit formed at the circuit board 303 and reach the electrodes 303c. As illustrated in FIGS. 23 and 24, the electrodes 303c are electrically connected with the anisotropic conductive rubber portions 331b embedded in the rubber sheet 331 via the electrodes 306c and the electrodes 306b formed at the film 306. In addition, the anisotropic conductive rubber portions 331b are electrically connected with the electrodes 412b formed at the wafer to be measured 402. Consequently, various types of electrical signals output by the peripheral devices and the source voltage are provided to the wafer to be measured 402 to electrically drive the wafer to be measured 402. The various types of electrical signals output by the wafer to be measured 402 travel through the anisotropic conductive rubber portions 331b embedded in the rubber sheet 331 and the electrodes 306b and 306c formed at the film 306 to be taken into the circuit board 303 via the electrodes 303c and are further sent out to the peripheral devices.

As explained above, the semiconductor device test apparatus e8 in the eighth embodiment achieves advantages similar to those achieved by semiconductor device test apparatus e7 in the seventh embodiment.

It is to be noted that it is necessary to take into consideration a possible deformation of the ball-shaped electrodes when conducting various types of functional tests on BGAs such as the wafer to be measured 402. In the case of the semiconductor device test apparatus e8 in the eighth embodiment, which is provided with the rubber sheet 331 that achieves elasticity and at the same time enables electrical connection only in the thicknesswise direction, the electrodes 412b formed at the wafer to be measured 402 do not become deformed. The anisotropic conductive rubber portions 331b provided at the rubber sheet 331 come in contact with the ball-shaped electrodes 412b provided at the wafer to be measured 402 over a larger area due to their elasticity. Thus, when the semiconductor device test apparatus e8 in the eighth embodiment is employed, the wafer to be measured 402 achieve reliable electrical connection with the peripheral devices to enable functional tests to be performed at a higher degree of accuracy.

It is to be noted that while the film 306 is provided at the semiconductor device test apparatus e8 in the eighth embodiment, a printed board may be utilized, instead.

Ninth Embodiment

Figure 25:
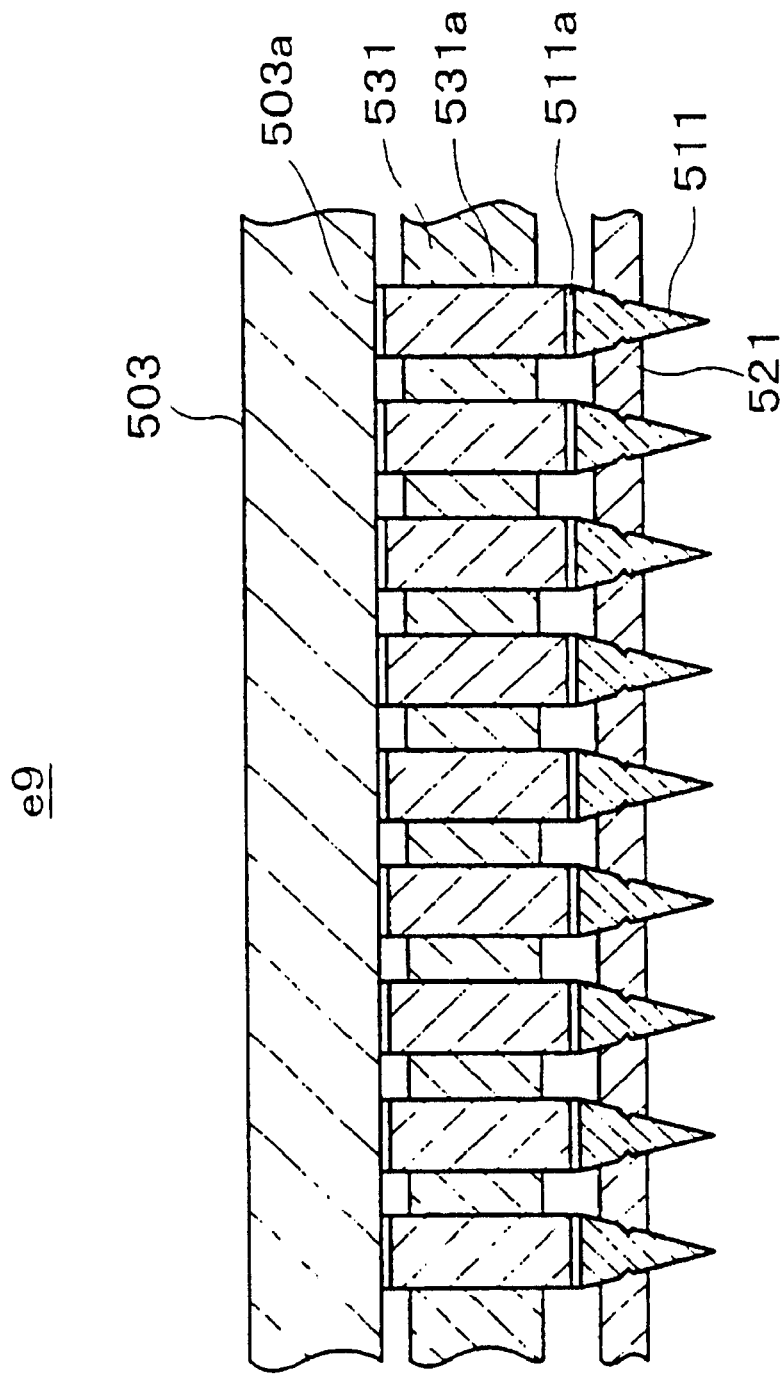
FIG. 25 is a perspective illustrating the structure of the semiconductor device test apparatus in a ninth embodiment.

A semiconductor device test apparatus e9 in the ninth embodiment of the present invention adopts a structure that includes a circuit board 503, probes 511, a probe sheet 521 and a rubber sheet 531, as illustrated in FIG. 25.

The circuit board 503 is connected to peripheral devices (not shown) to allow input and output of various types of electrical signals and a source voltage.

The probes 511 are constituted of tungsten or beryllium copper. In addition, contact portions 511a of the probes 511 where they come in contact with the rubber sheet 531 are clad with gold plate to prevent oxidation and to assure good contact. It is to be noted that the gold-plating treatment is not restricted to be implemented on the contact portions 511a only, and may be implemented over the entire surfaces of the probes 511.

Figure 26:
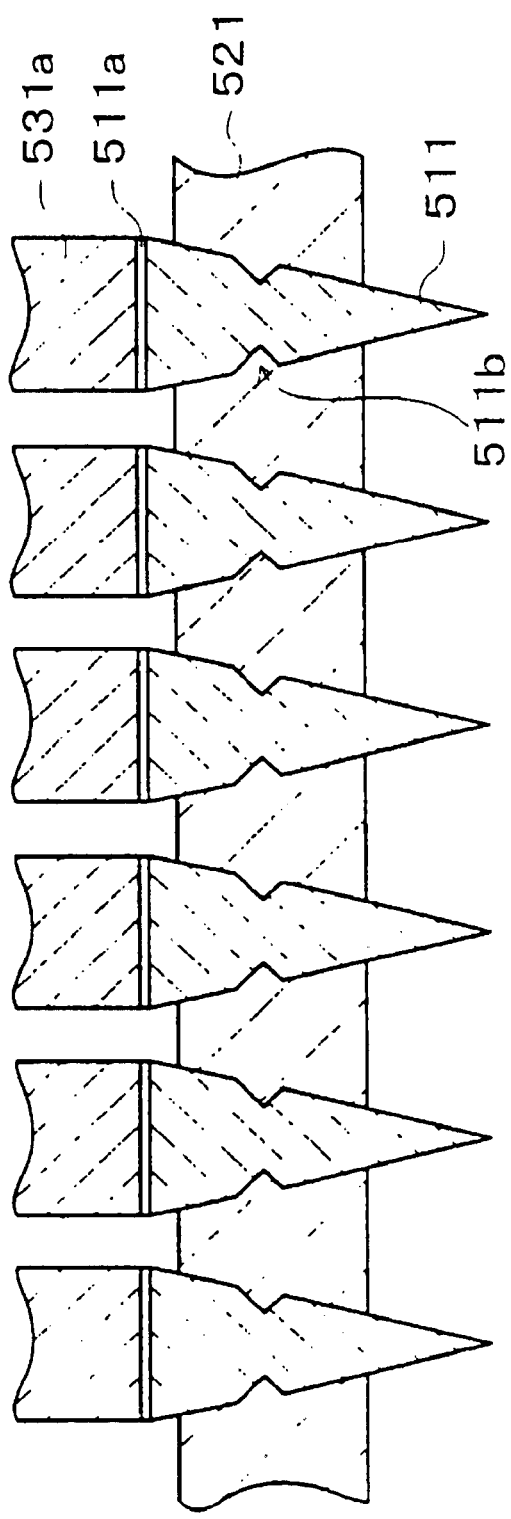
FIG. 26 is an enlargement of the sectional view of the semiconductor device test apparatus in FIG. 25.

The probe sheet 521 may be constituted of a rubber sheet having a heat resistant property or a membrane sheet formed from glass fiber/polyimide. In addition, the probes 511 are embedded in the probe sheet 521, and are each provided with notches 511b as illustrated in FIG. 26 to ensure that they do not slip out of the probe sheet 521.

The rubber sheet 531 is provided with anisotropic conductive rubber portions 531a to electrically connect a plurality of electrodes 503a formed at the circuit board 503 and the contact portions 511a at the plurality of probes 511.

Figure 27:
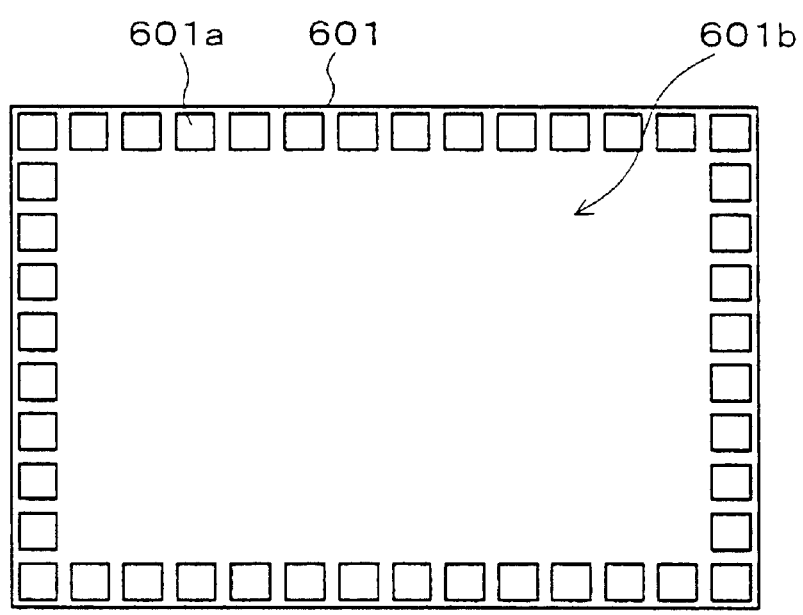
FIG. 27 is a plan view of an IC chip that may be tested by using the semiconductor device test apparatus in FIG. 25.

Now, a wafer to be measured upon which various types of functional tests may be conducted employing the semiconductor device test apparatus e9 in the ninth embodiment is explained. As an example to facilitate the explanation, an IC chip 601 formed in one partitioned area of the wafer to be measured is illustrated in FIG. 27. The IC chip 601 is provided with a plurality of pads 601a. Normally, the pads 601a will be constituted of aluminum. In addition, the entire area of the IC chip 601 where the pads 601a are not present (in particular, the area where the circuit is formed) is protected from the outside atmosphere by a resist film 601b.

Figure 28:
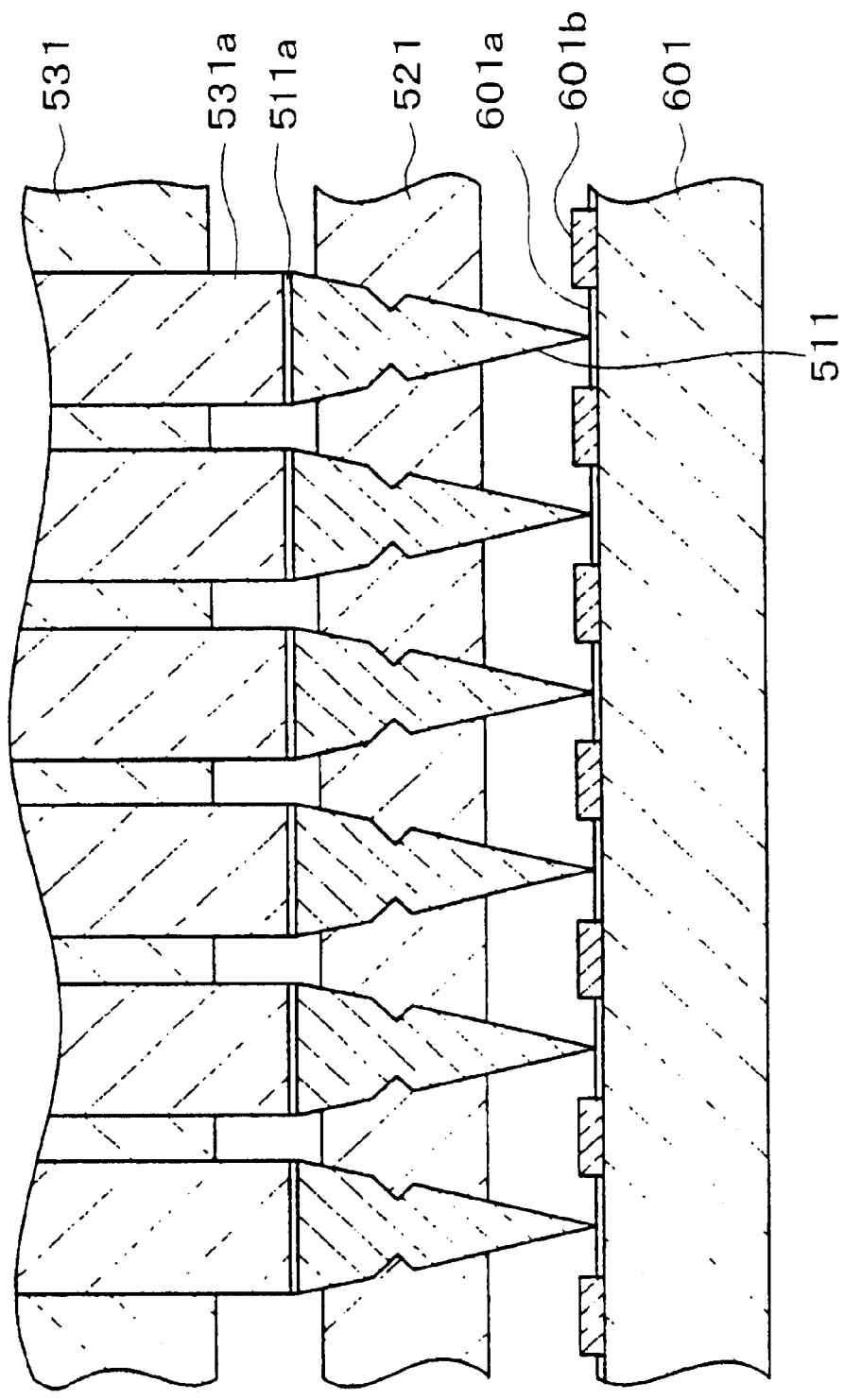
FIG. 28 is a sectional view illustrating a state in which the IC chip in FIG. 27 is in contact with the semiconductor device test apparatus illustrated in FIG. 25.
Figure 29:
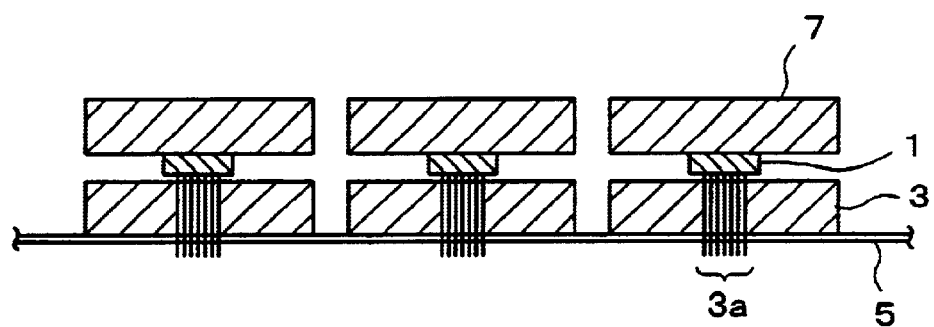
FIG. 29 is a sectional view illustrating the connections among a device to be measured, an IC socket and a circuit board in the prior art.
Figure 30:
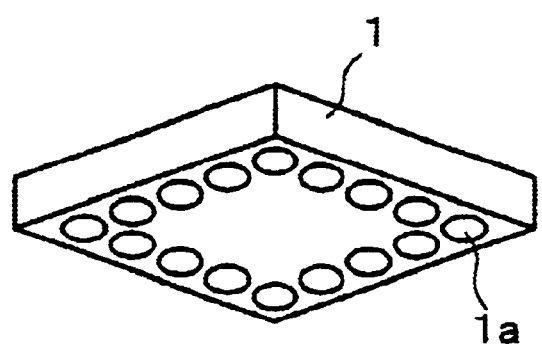
FIG. 30 is a perspective of the device to be measured in FIG. 29, illustrating its surface where electrodes are formed.
Figure 31:
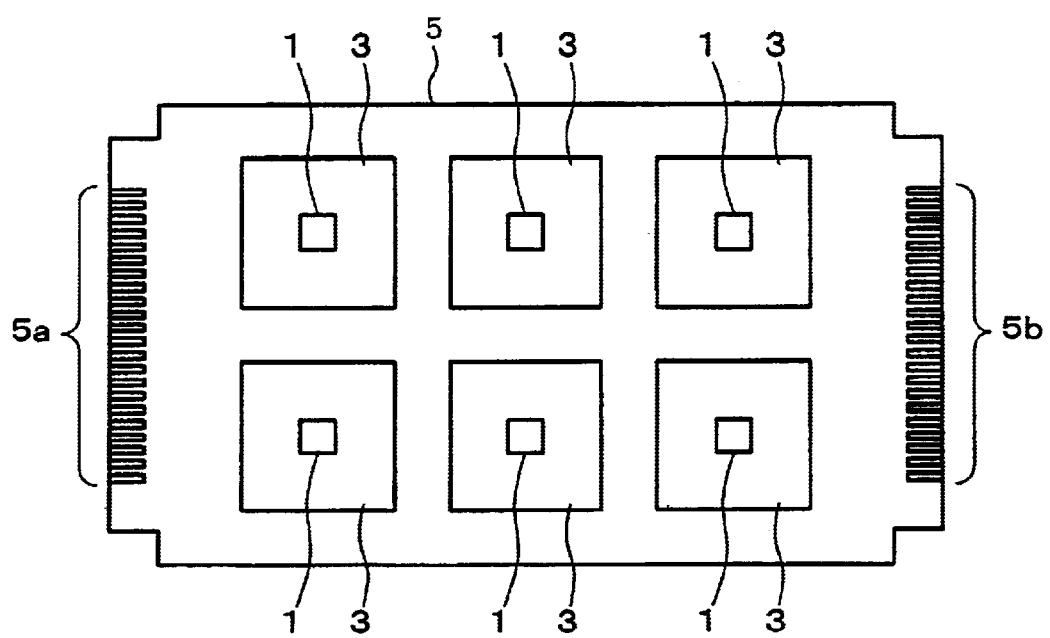
FIG. 31 is a plan view of a circuit board with the devices to be measured and the IC sockets in FIG. 29 mounted.
Figure 32:
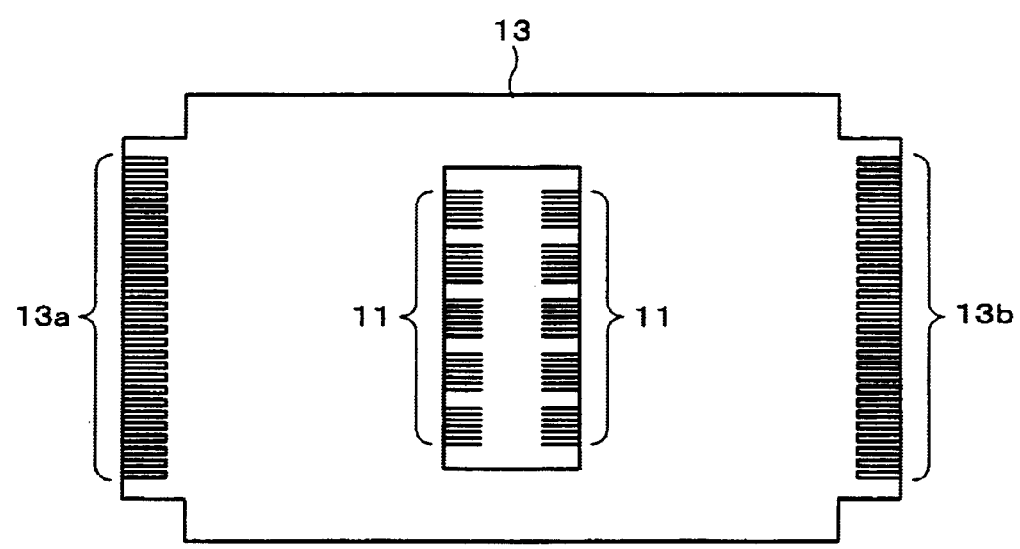
FIG. 32 is a plan view of a probe card 13 provided with probes of the prior art.
Figure 33:
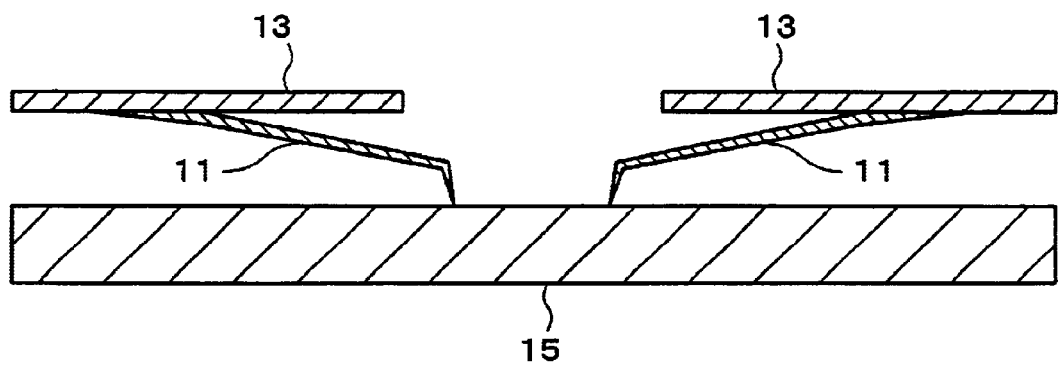
FIG. 33 is a sectional view illustrating a state in which the wafer is in contact with the probes provided at the probe card illustrated in FIG. 32.

When conducting various types of functional tests on the IC chip 601 employing the semiconductor device test apparatus e9 in the ninth embodiment, the individual probes 511 are placed in contact with the corresponding pads 601a as illustrated in FIG. 28. As described above, since no resist film 601b is formed at the pads 601a, the pads 601a and the probes 511 become electrically connected.

When conducting a functional test on the IC chip 601, various types of electrical signals output by the peripheral devices (not shown) and the source voltage are input to the circuit board 503, travel through the wiring circuit formed at the circuit board 503 and reach the electrodes 503a. During this process, the electrodes 503a are electrically connected with the probes 511 via the anisotropic conductive rubber portions 531a provided at the rubber sheet 531, as illustrated in FIG. 25. Consequently, the various types of electrical signals output by the peripheral devices and the source voltage are provided to the IC chip 601 via the probes 511 to electrically drive the IC chip 601. In addition, various types of electrical signals output by the IC chip 601 travel through the probes 511 and the anisotropic conductive rubber portions 531a provided at the rubber sheet 531 to be taken into the circuit board 503 via the electrodes 503a and they are then sent out to the peripheral devices.

In addition, even if slight level differences are formed at the individual pads due to, for instance, the laminated structure assumed by the IC chip 601, these stages are absorbed by the rubber sheet 531 and the probe sheet 521 so that the individual probes 511 come into contact with the pads 601a formed at the IC chip 601 with a high degree of reliability. Furthermore, some margin is obtained in regard to the accuracy of the front end alignment for the individual probes 511 when manufacturing the semiconductor device test apparatus e9 in the ninth embodiment.

As explained above, in the semiconductor device test apparatus e9 in the ninth embodiment provided with the probes 511, which are constituted of tungsten or beryllium copper and are placed in contact with the object of testing, durability against contact is achieved that is comparable to that of a probe card 13 in the prior art. Thus, the semiconductor device test apparatus e9 in the ninth embodiment may be employed in a product inspection process as well as in functional tests conducted during the semiconductor device development stage.

Furthermore, the semiconductor device test apparatus e9, which assumes a structure in which the front ends of the probes 511 are placed in contact with the object of testing in a perpendicular attitude, is capable of supporting a finer pitch of the pads at the object of testing (eg. an electrode pitch of 0.5 mm or smaller). In addition, it is possible to place the probes 511 in contact with all the pads formed at the object of testing simultaneously. Also, the probes 511 may be embedded in the probe sheet 521 through an automated process to achieve a low production cost for mass production.

Moreover, the semiconductor device test apparatus e9 in the ninth embodiment may be combined with a wafer-level test/burn-in apparatus. This will make it possible to reduce the level of investment in the tester employed in tests on finished semiconductor device products, which ultimately leads to reductions in the test cost and the device cost.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

As has been explained, according to the present invention, tests on semiconductor devices having electrodes provided at a fine pitch can be conducted with ease and at low cost. In addition, the durability of the semiconductor device test apparatus against repeated tests can be improved. Furthermore, since batch-testing of a great number of semiconductor devices is enabled, higher efficiency in testing is achieved.

The entire disclosure of Japanese Patent Application No. 11-66621 filed on Mar. 12, 1999 including specification, claims, drawings and summary is incorporated herein by reference in its entirety.

What is claimed is:

1. A method for manufacturing semiconductor devices, the method comprising:

providing a semiconductor wafer with a front surface having a plurality of circuit elements formed thereon, wherein the semiconductor wafer has a back surface opposite to the front surface;

forming on the front surface a plurality of electrodes connected to the circuit elements;

inserting the wafer into a burn-in apparatus, wherein the semiconductor wafer is positioned in a positioning plate having a hole, the hole being formed in a shape conforming to an outer shape of the semiconductor wafer;

testing the circuit elements in the burn-in apparatus for electrical functions, through the electrodes, with the back surface of the wafer exposed to convective air in the burn-in apparatus; and dividing the wafer into a plurality of semiconductor devices.

2. A method according to claim 1, wherein said dividing includes dividing the wafer after said testing.

3. A method according to claim 2, further comprising:

mounting the wafer on a circuit board with an elastic sheet interposed therebetween, including electrically connecting wiring circuits on the circuit board to the electrodes on the wafer through conductive elastic portions of the elastic sheet.

4. A method according to claim 3, further comprising:

disposing over the back surface of the wafer a holding plate having a through hole;

pressing the wafer on the circuit board with the holding plate; and providing the convective air over the back surface of the wafer through the through hole.

5. A method according to claim 2, further comprising:

mounting the wafer on a circuit board with a film interposed therebetween, including electrically connecting wiring circuits on the circuit board to the electrodes on the wafer through bump electrodes in the film.

6. A method according to claim 5, further comprising:

disposing over the back surface of the wafer a holding plate having a through hole;

pressing the wafer on the circuit board with the holding plate; and providing the convective air over the back surface of the wafer through the through hole.

7. A method according to claim 1, further comprising the step of forming a plurality of solder balls as the electrodes.

8. A method for manufacturing semiconductor devices, the method comprising:

preparing a semiconductor wafer with a first surface and a second surface, the second surface being opposite to the first surface, wherein the first surface has a plurality of circuit elements formed thereon;

forming a plurality of electrodes on the first surface, the electrodes being connected to the circuit elements;

inserting the semiconductor wafer into a burn-in apparatus, wherein the semiconductor wafer is positioned in a positioning plate having a hole, the hole being formed in a shape conforming to an outer shape of the semiconductor wafer;

testing the circuit elements in the burn-in apparatus for electrical function, through the electrodes, with the second surface of the semiconductor wafer exposed to convective air in the burn-in apparatus; and dividing the semiconductor wafer into the plurality of semiconductor devices.

9. A method according to claim 8, wherein the dividing includes dividing the semiconductor wafer after the testing.

10. A method according to claim 9, further comprising mounting the semiconductor wafer on a circuit board with an elastic sheet interposed therebetween, including electrically connecting wiring circuits on the circuit board to the electrodes on the semiconductor wafer through conductive elastic portions of the elastic sheet.

11. A method according to claim 10, further comprising:

disposing over the second surface of the semiconductor wafer a holding plate having a through hole;

pressing the semiconductor wafer on the circuit board with the holding plate; and providing the convective air over the second surface of the semiconductor wafer through the through hole.

12. A method according to claim 9, further comprising mounting the semiconductor wafer on a circuit board with a film interposed therebetween, including electrically connecting wiring circuits on the circuit board to the electrodes on the semiconductor wafer through bump electrodes in the film.

13. A method according to claim 12, further comprising:

disposing over the second surface of the semiconductor wafer a holding plate having a through hole;

pressing the semiconductor wafer on the circuit board with the holding plate; and providing the convective air over the second surface of the semiconductor wafer through the through hole.

14. A method according to claim 8, further comprising forming a plurality of solder balls as the electrodes.

* * * * *